(12) United States Patent
Liu

(10) Patent No.: US 11,527,480 B2
(45) Date of Patent: Dec. 13, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Chao Wei Liu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 54 days.

(21) Appl. No.: 16/864,092

(22) Filed: Apr. 30, 2020

(65) Prior Publication Data

US 2021/0343649 A1 Nov. 4, 2021

(51) Int. Cl.
| | |
|---|---|
| *H01L 23/538* | (2006.01) |
| *H01L 23/31* | (2006.01) |
| *H01L 21/78* | (2006.01) |
| *H01L 21/48* | (2006.01) |
| *H01L 21/56* | (2006.01) |

(52) U.S. Cl.
CPC ...... *H01L 23/5385* (2013.01); *H01L 21/4853* (2013.01); *H01L 21/565* (2013.01); *H01L 21/78* (2013.01); *H01L 23/3128* (2013.01); *H01L 23/5386* (2013.01)

(58) Field of Classification Search
None
See application file for complete search history.

(56) References Cited

U.S. PATENT DOCUMENTS

| | | | |
|---|---|---|---|
| 8,143,100 B2 | 3/2012 | Karnezos | |
| 9,171,797 B2 | 10/2015 | Lin et al. | |
| 9,190,367 B1* | 11/2015 | Liao | H01L 23/49827 |
| 2005/0199993 A1* | 9/2005 | Lee | H01L 23/552 |
| | | | 257/686 |
| 2011/0049704 A1* | 3/2011 | Sun | H01L 21/50 |
| | | | 257/E23.116 |
| 2016/0172331 A1* | 6/2016 | Yu | H01L 23/5384 |
| | | | 257/773 |
| 2018/0122763 A1* | 5/2018 | Chow | H01L 24/16 |

FOREIGN PATENT DOCUMENTS

| | | |
|---|---|---|
| JP | 4114629 B2 | 7/2008 |
| JP | 2008-311267 A | 12/2008 |

\* cited by examiner

*Primary Examiner* — Jay C Chang
(74) *Attorney, Agent, or Firm* — Foley & Lardner LLP

(57) ABSTRACT

A semiconductor device package and a method for manufacturing the semiconductor device package are provided. The semiconductor device package includes a first substrate, a second substrate and an interconnection. The second substrate is arranged above the first substrate and has an opening. The interconnection passes through the opening and connects to the first substrate and the second substrate.

19 Claims, 37 Drawing Sheets

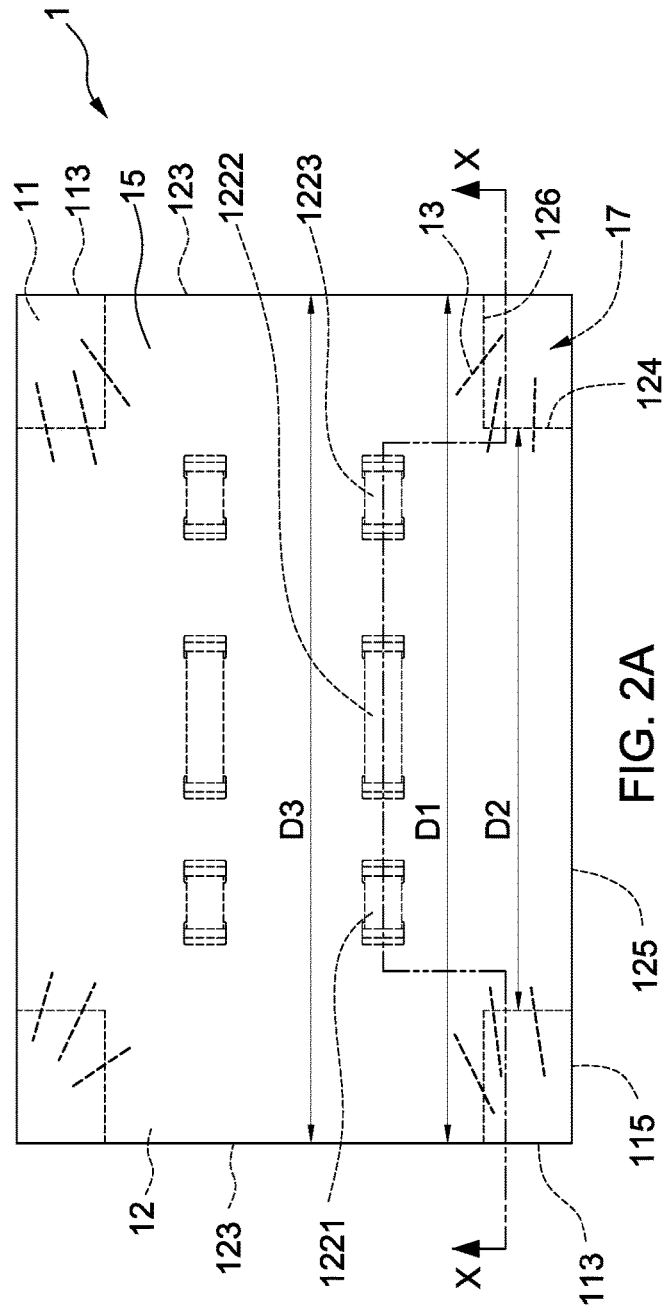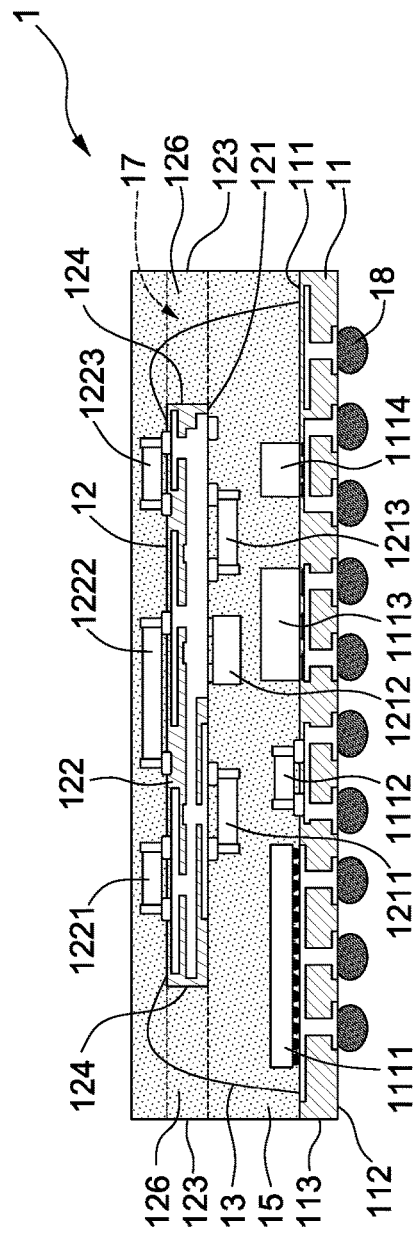

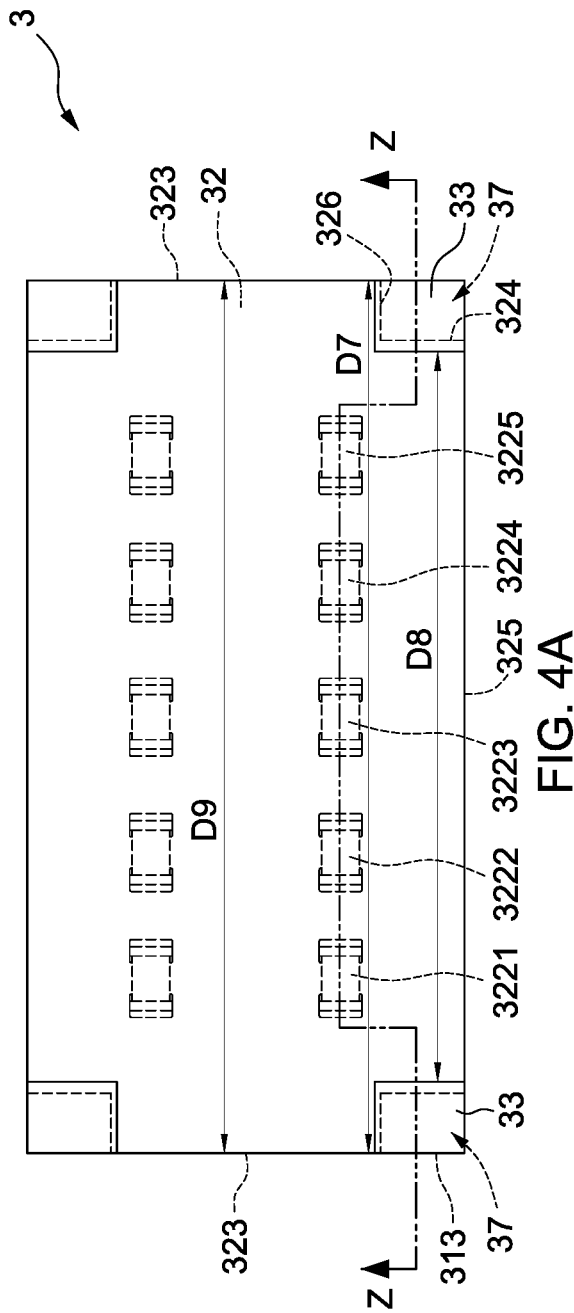
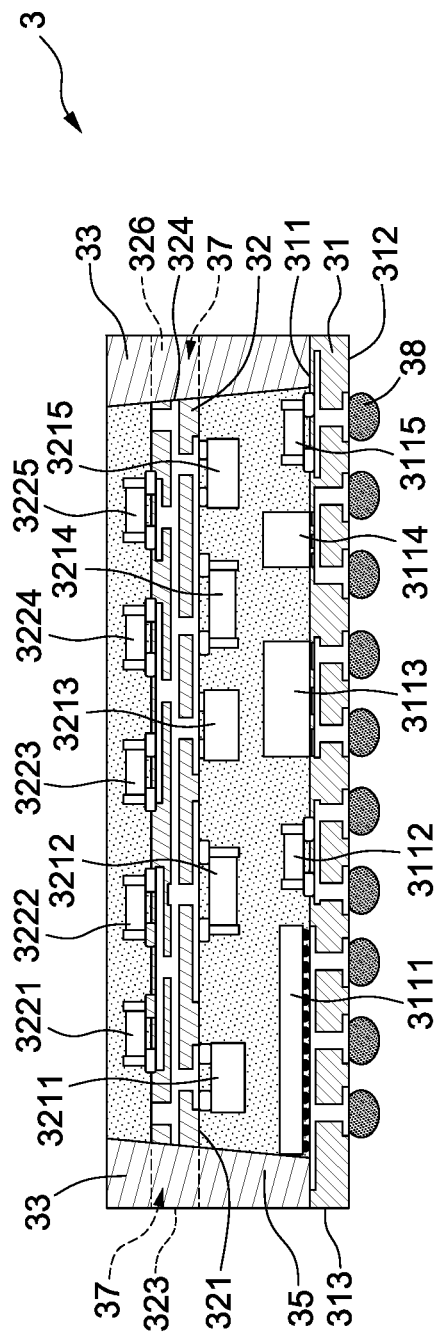
FIG. 4A
FIG. 4B

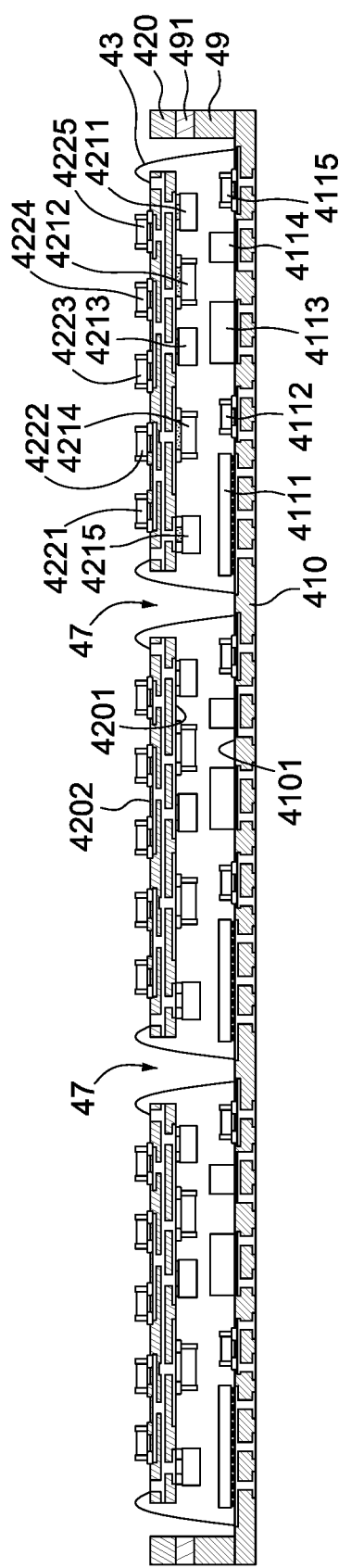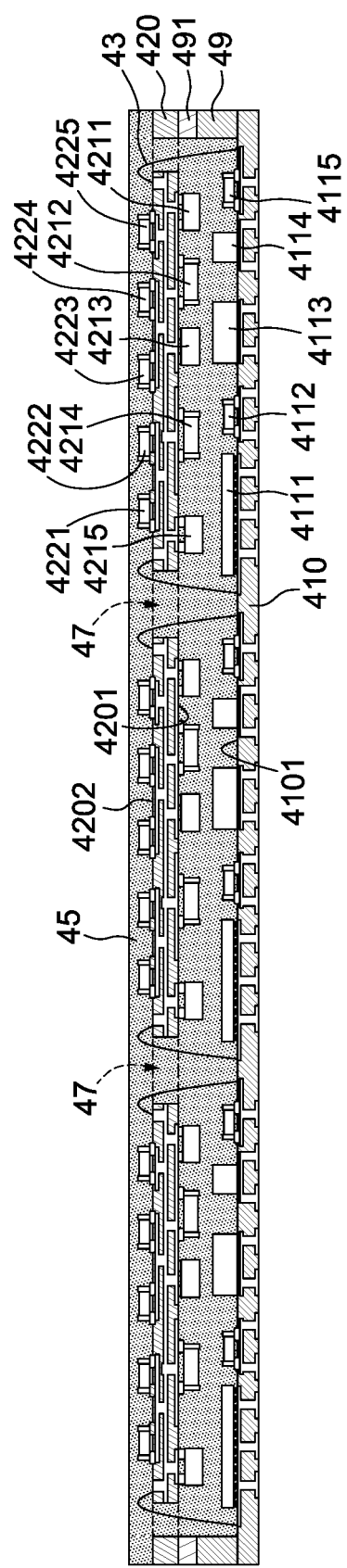
FIG. 5G
FIG. 5H

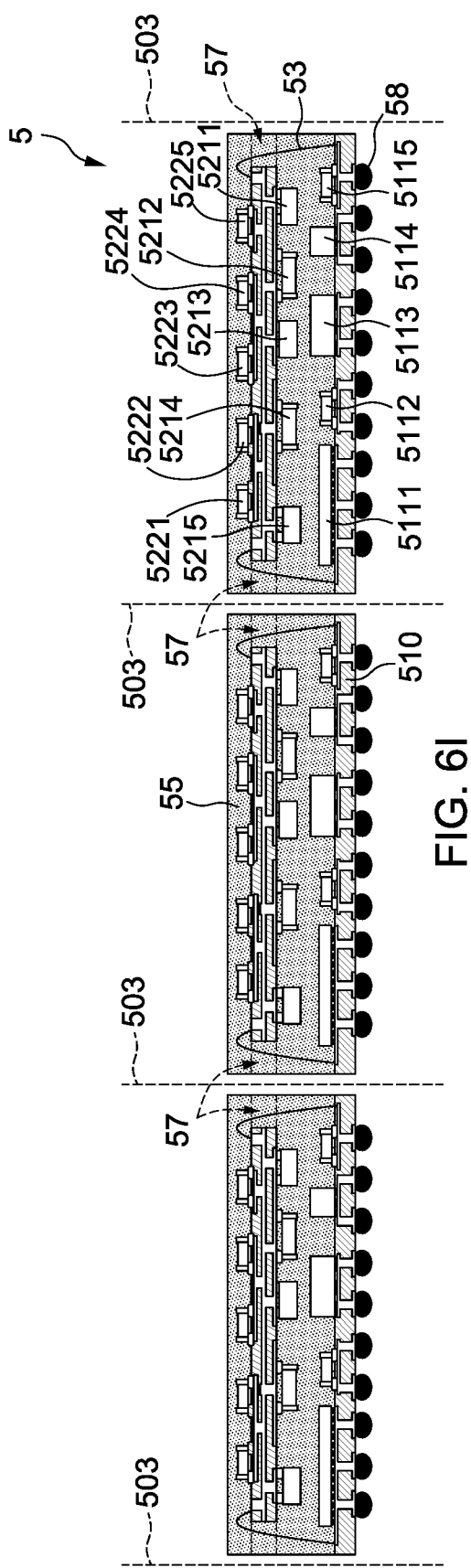
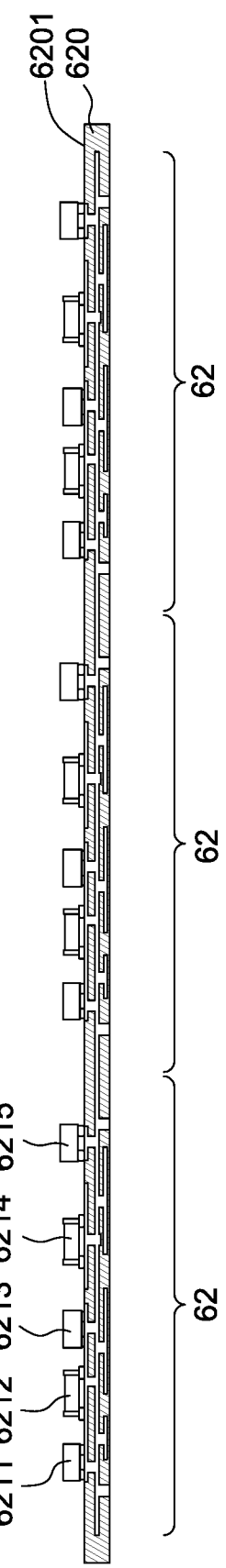
FIG. 6I
FIG. 7A

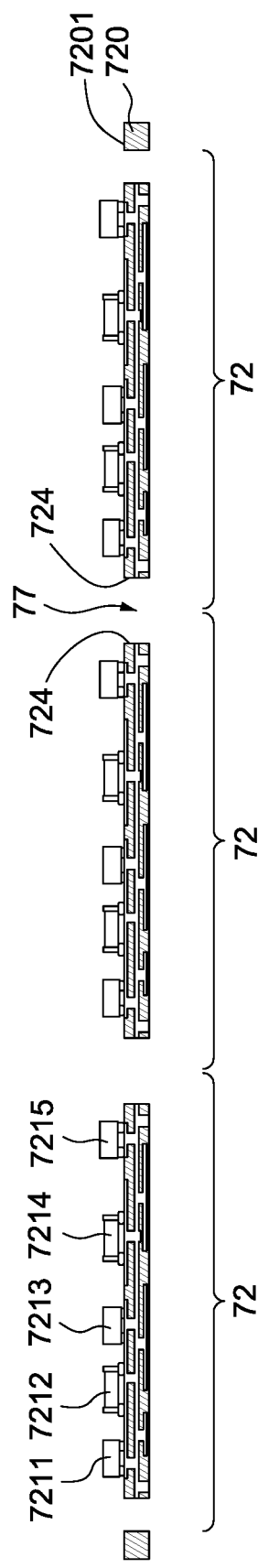
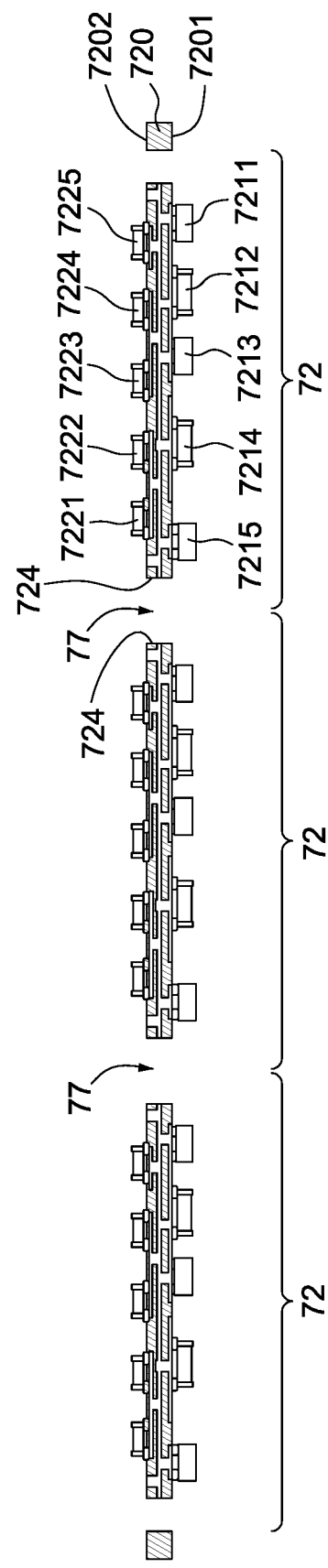
FIG. 8A
FIG. 8B

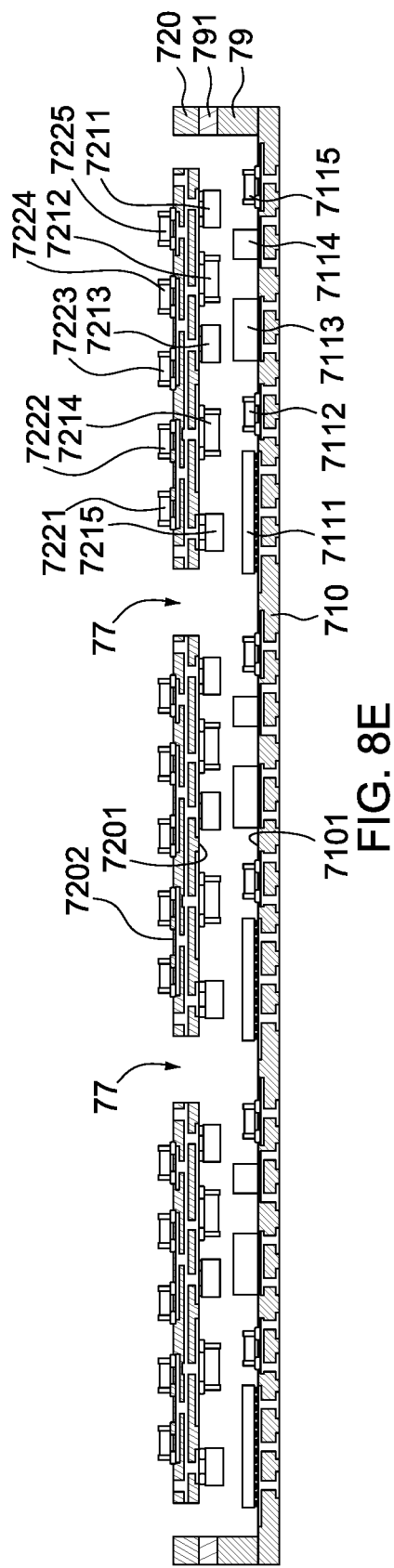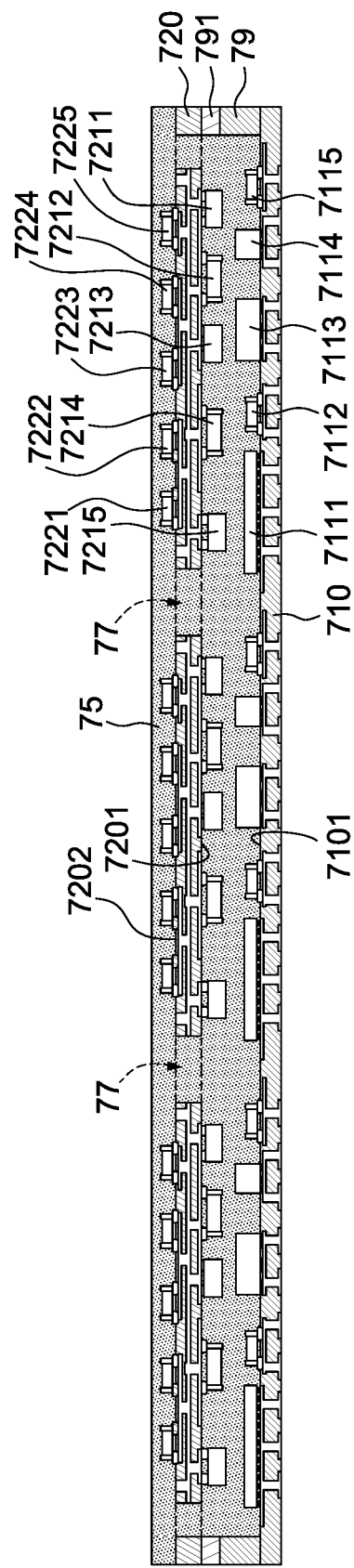

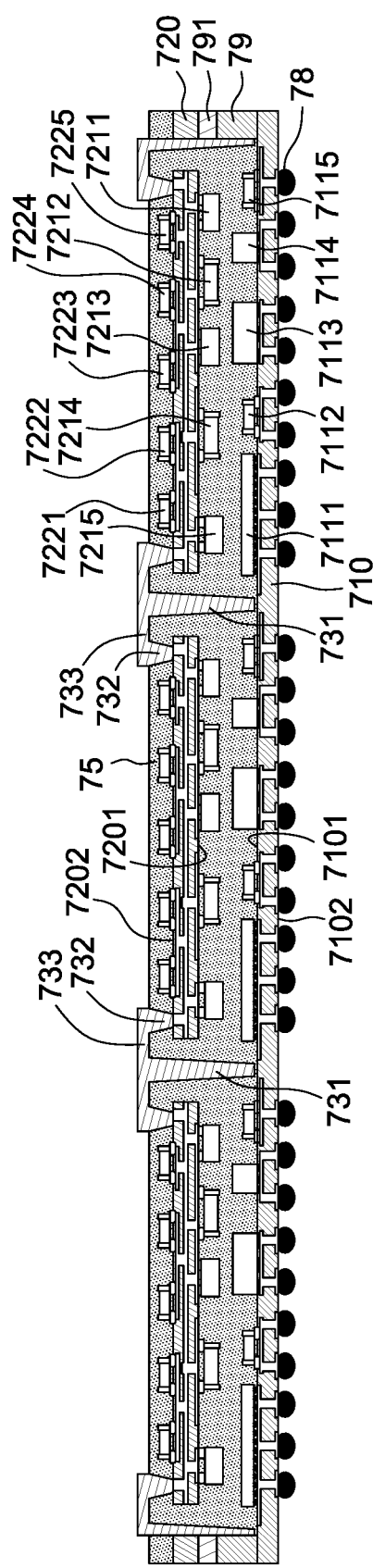
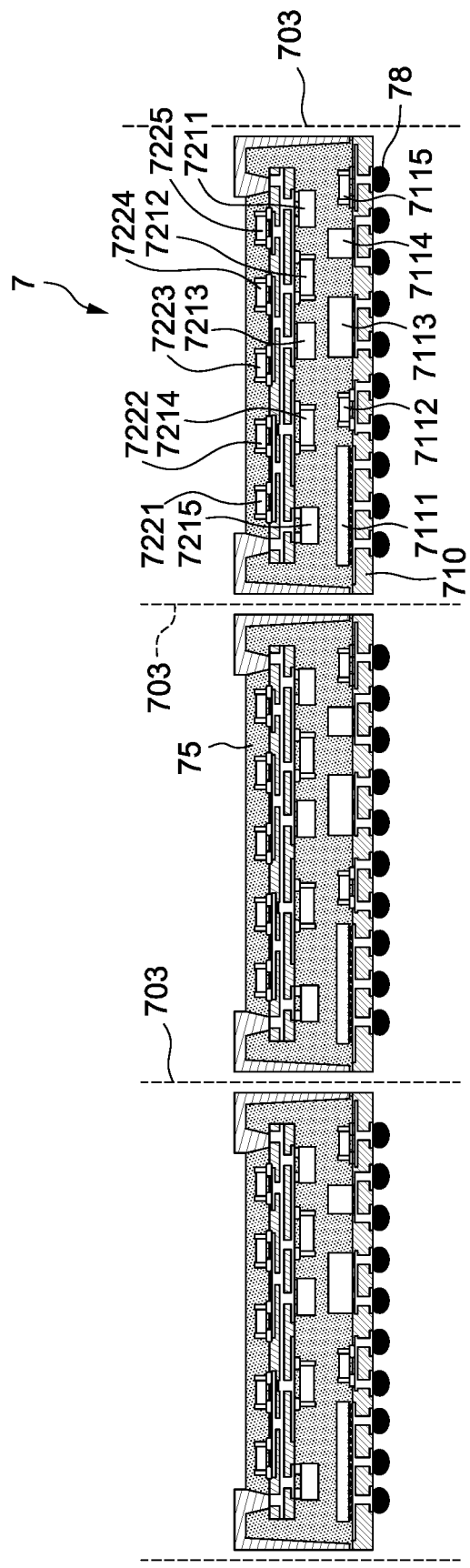
FIG. 8I
FIG. 8J

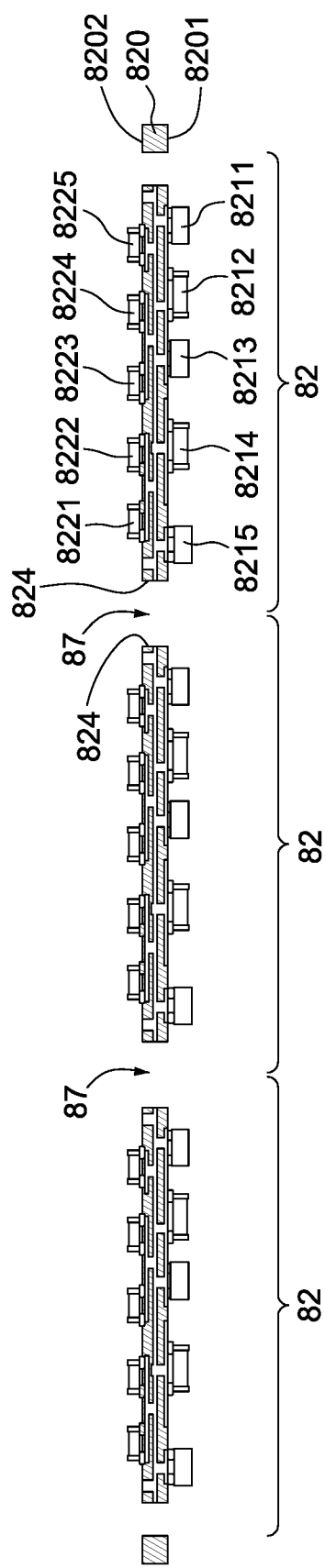
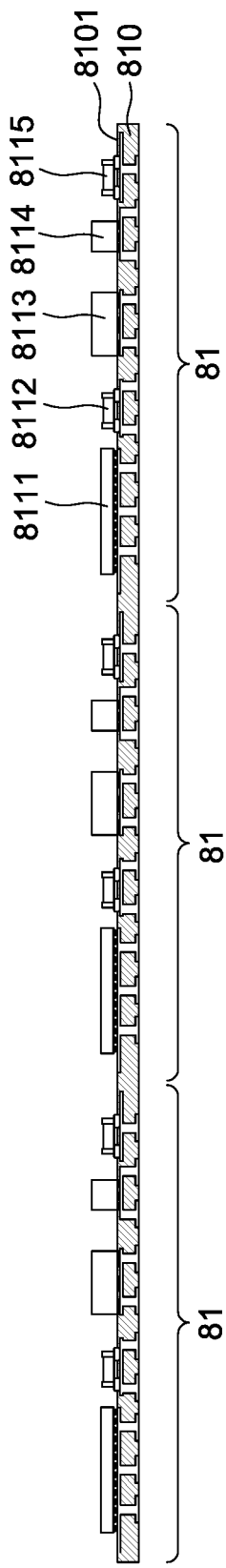
FIG. 9C
FIG. 9D

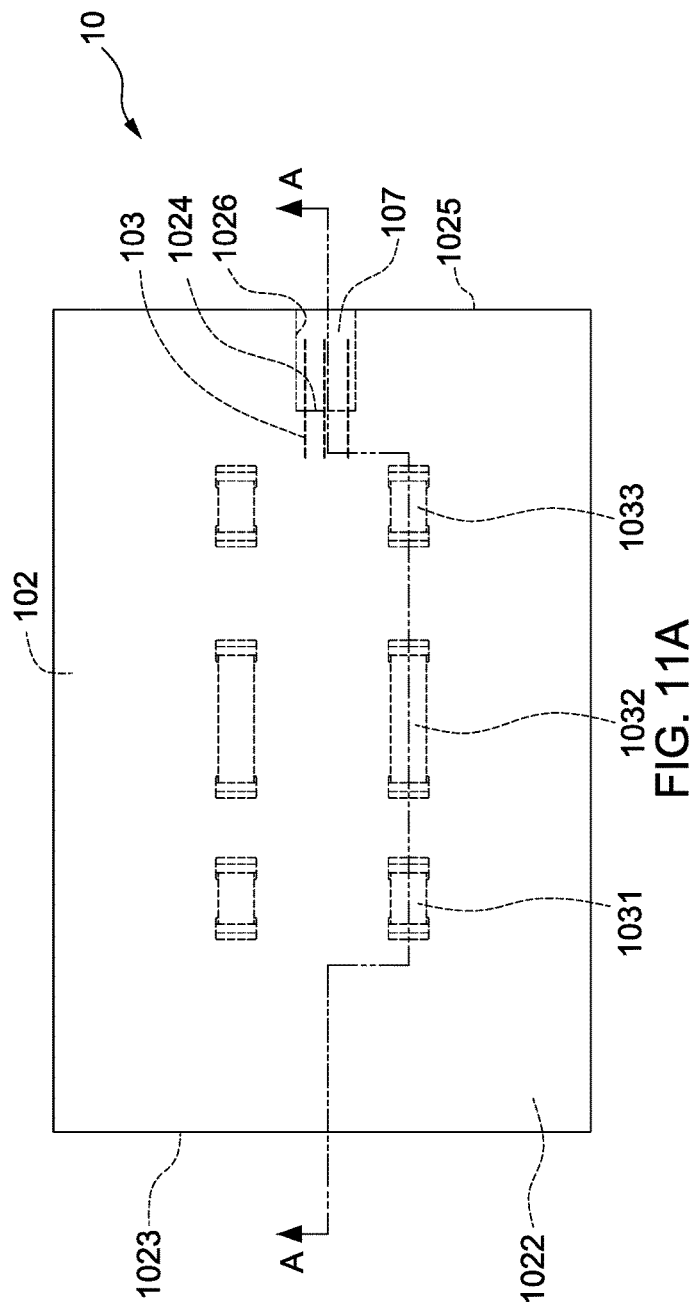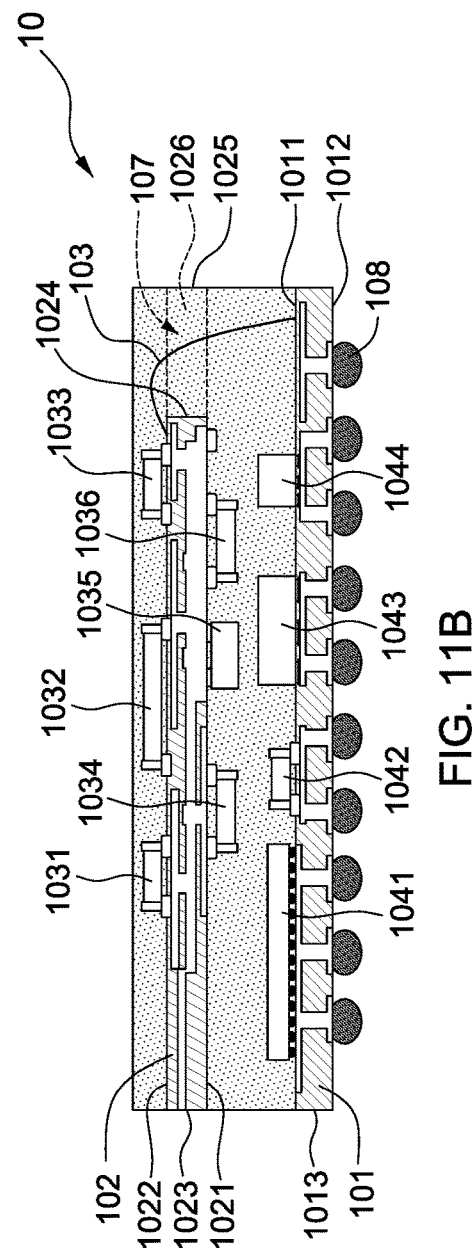

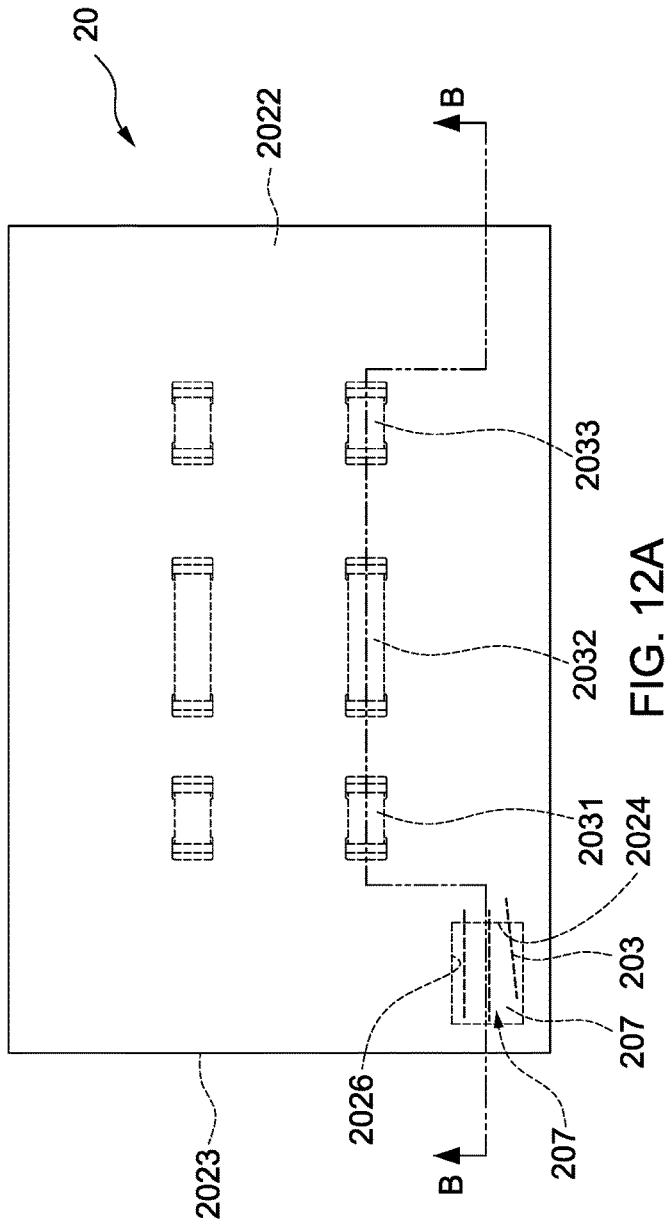
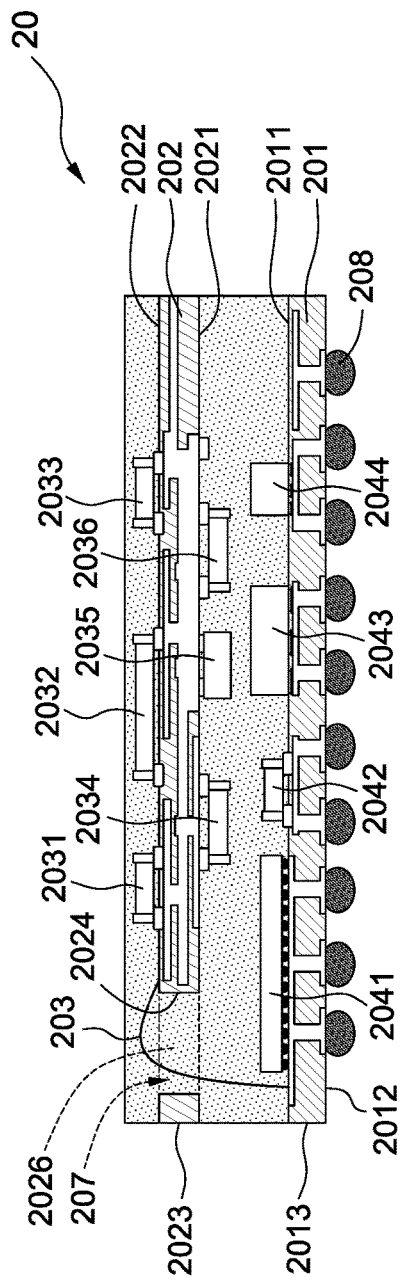
FIG. 12A
FIG. 12B

SEMICONDUCTOR DEVICE PACKAGE AND METHOD OF MANUFACTURING THE SAME

BACKGROUND

1. Field of the Disclosure

The instant disclosure relates to, amongst other things, a semiconductor device package and method of manufacturing the same.

2. Description of Related Art

In a typical 2.5D or 3D stacking module, the interposers are used to connect and support two boards. However, since the distance between two boards is not easily controlled or the stacking module may have a warpage issue, the interposers may not properly connect two boards.

SUMMARY

According to one example embodiment of the instant disclosure, a semiconductor device package includes a first substrate, a second substrate and an interconnection. The first substrate has a first side surface. The second substrate is arranged above the first substrate and has a first side surface coplanar with the first side surface of the first substrate and an opening. The interconnection passes through the opening and connects to the first substrate and the second substrate. The interconnection overlaps a side surface of the opening from a side view perspective.

According to another example embodiment of the instant disclosure, a semiconductor device package includes a first substrate, a second substrate and an interconnection. The first substrate having a first surface and a first side surface. The second substrate is arranged above the first substrate. Further, the second substrate has a first surface facing the first surface of the first substrate, a second surface opposite to the first surface of the second substrate, a first side surface coplanar with the first side surface of the first substrate and a second side surface disposed on the first surface of the first substrate from a top view perspective. The interconnection connects to the first substrate and the second substrate and is adjacent to the second side surface of the second substrate. The interconnection overlaps the first surface of the first substrate and the first surface of the second substrate from the top view perspective.

According to another example embodiment of the instant disclosure, method of manufacturing a semiconductor device package includes: providing a first strip substrate comprising a number of first substrates; stacking a second strip substrate above the first strip substrate, wherein the second strip substrate comprises a number of second substrates and at least one opening; and forming an interconnections, wherein the interconnection connects the first strip substrate and the second strip substrate and passes through the opening.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

BRIEF DESCRIPTION OF THE DRAWINGS

FIG. 2A is a top view of a semiconductor device package in accordance with an embodiment of the instant disclosure.

FIG. 2B illustrates a cross-sectional view along line X-X in FIG. 2A.

FIG. 4A is a top view of a semiconductor device package in accordance with an embodiment of the instant disclosure.

FIG. 4B illustrates a cross-sectional view along line Z-Z in FIG. 4A.

FIG. 5A, FIG. 5B, FIG. 5C, FIG. 5D, FIG. 5E, FIG. 5F, FIG. 5G, FIG. 5H, FIG. 5I and FIG. 5J, illustrate a method of manufacturing a semiconductor device package in accordance with another embodiment of the instant disclosure.

FIG. 6A, FIG. 6B, FIG. 6C, FIG. 6D, FIG. 6E, FIG. 6F, FIG. 6G, FIG. 6H and FIG. 6I, illustrate a method of manufacturing a semiconductor device package in accordance with another embodiment of the instant disclosure.

FIG. 7A, FIG. 7B, FIG. 7C, FIG. 7D, FIG. 7E, FIG. 7F, FIG. 7G, FIG. 7H, FIG. 7I, FIG. 7J and FIG. 7K illustrate a method of manufacturing a semiconductor device package in accordance with another embodiment of the instant disclosure.

FIG. 8A, FIG. 8B, FIG. 8C, FIG. 8D, FIG. 8E, FIG. 8F, FIG. 8G, FIG. 8H, FIG. 8I and FIG. 8J, illustrate a method of manufacturing a semiconductor device package in accordance with another embodiment of the instant disclosure.

FIG. 9A, FIG. 9B, FIG. 9C, FIG. 9D, FIG. 9E, FIG. 9F, FIG. 9G, FIG. 9H, FIG. 9I, FIG. 9J and FIG. 9K illustrate a method of manufacturing a semiconductor device package in accordance with another embodiment of the instant disclosure.

FIG. 11A is a top view of a semiconductor device package in accordance with an embodiment of the instant disclosure.

FIG. 11B illustrates a cross-sectional view along line A-A in FIG. 11A.

FIG. 12A is a top view of a semiconductor device package in accordance with an embodiment of the instant disclosure.

FIG. 12B illustrates a cross-sectional view along line B-B in FIG. 12A.

DETAILED DESCRIPTION

Figure 1:
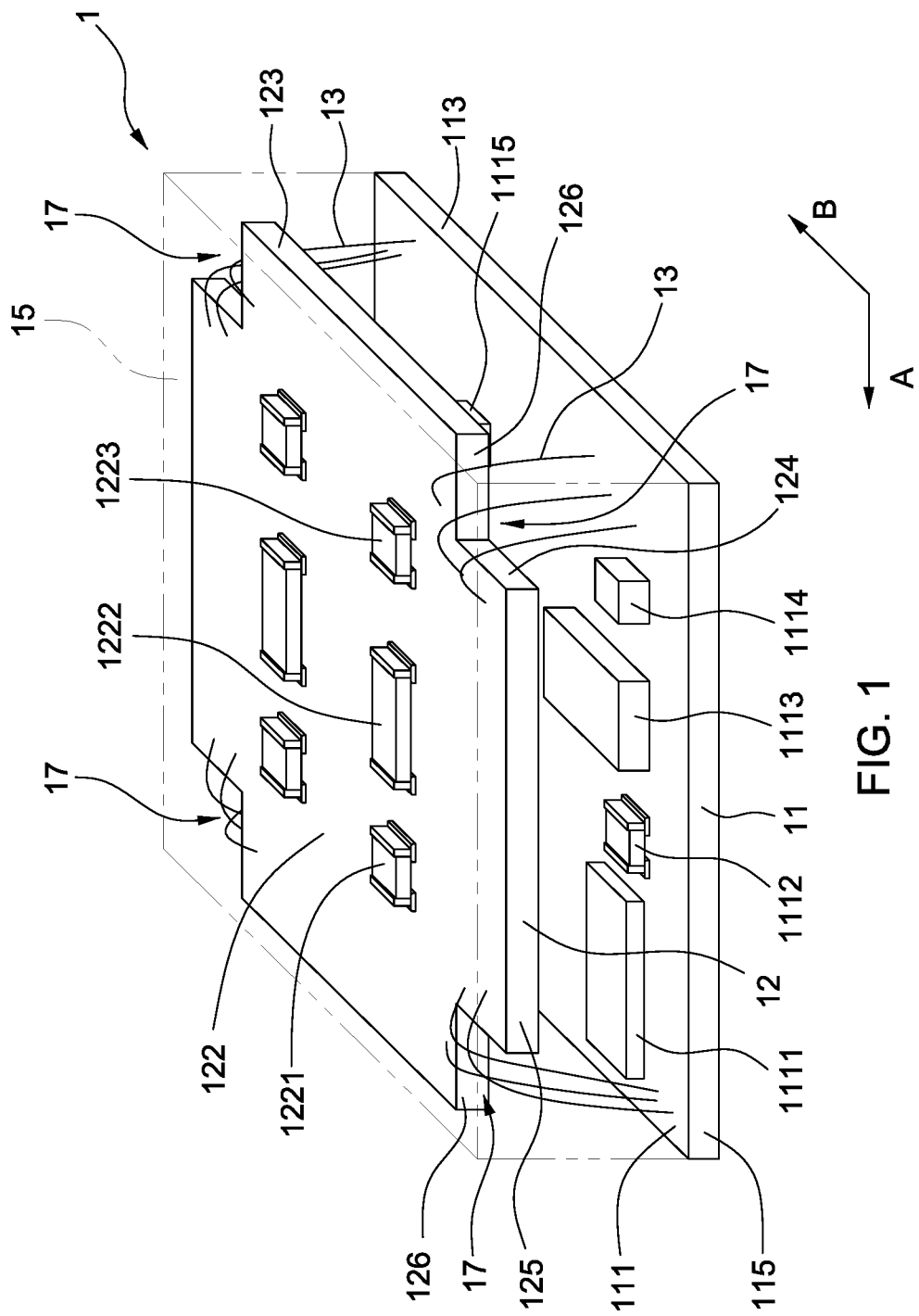
FIG. 1 is a perspective view of a semiconductor device package in accordance with an embodiment of the instant disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosure provides a semiconductor device package with a multilayer structure includes at least two staking modules. The modules are electrically connected to each other by interconnections. There is no interposer between two staking modules. This configuration prevents the semiconductor device package from being short-circuited in the heating process, and thus the electrical connection between the modules is improved. Further, the configuration causes the semiconductor device package to have more space to accommodate more electronic components.

FIG. 1 is a perspective view of a semiconductor device package 1 in accordance with some embodiments of the present disclosure. As shown in FIG. 1, the semiconductor device package 1 includes substrates 11 and 12, semiconductor devices 1111, 1112, 1113, 1114, 1115, 1221, 1222 and 1223, bonded wires 13 and an encapsulant 15. In some embodiments, the substrate 11 may be a core substrate or a core-less substrate. The substrate 11 may include traces, pads or interconnections for electrical connection. The substrate 11 has a surface 111, and a number of the semiconductor devices 1111, 1112, 1113, 1114 and 1115 are disposed or mounted on the surface 111 of the substrate 11. The semiconductor devices 1111, 1112, 1113, 1114 and 1115 may be a die, an active device, a passive device, and/or other electronic devices. The semiconductor devices 1111, 1112, 1113, 1114 and 1115 may electrically connected to the substrate 11 via flip-chip bonding or wire bonding. Further, in some embodiments of the present disclosure, the substrate 12 may be a core substrate or a core-less substrate. The substrate 12 may include traces, pads or interconnections for electrical connection. The substrate 12 has a surface 122 (e.g., an upper surface) facing away from the surface 111 of the substrate 11, and a number of the semiconductor devices 1221, 1222 and 1223 are disposed or mounted on the surface 122 of the substrate 12. The semiconductor devices 1221, 1222 and 1223 may be a die, an active device, a passive device, and/or other electronic devices. The semiconductor devices 1221, 1222 and 1223 may electrically connected to the substrate 12 via flip-chip bonding or wire bonding.

Referring to FIG. 1, the substrate 11 has a surface 113 (e.g., a side surface) and the substrate 12 has a surface 123 (e.g., a side surface), and the surface 113 and the surface 123 are coplanar with each other. The substrate 11 has a surface 115 (e.g., a front surface) and the substrate 12 has a surface 125 (e.g., a front surface), and the surface 115 and the surface 125 are coplanar with each other. In some embodiments of the present disclosure, the substrate 12 includes four openings 17 which are respectively adjacent to four corners of the substrate 12. Thus, the substrate 12 has a surface 124 connecting to the surface 125 and a surface 126 connecting to the surface 123. In some embodiments of the present disclosure, the surfaces 124 and 126 are connected to each other. In some embodiments of the present disclosure, the surfaces 124 and 126 are not coplanar with each other. As shown in FIG. 1, the surfaces 124 and 126 are portions of the inner walls of the opening 17. In other words, the opening 17 includes the side surfaces 124 and 126. From a top view perspective, the surfaces 124 and 126 can be disposed on the surface 111 of the substrate 11. Further, a number of bonded wires 13 extends from the surface 111 of the substrate 11 to the surface 122 of the substrate 12 and pass through the openings 17. Thus, the substrates 11 and 12 are electrically connected to each other by the bonded wires 13. Since the bonded wires 13 passes through the opening 17, the bonded wire 13 overlaps the surface 124 in a view taken from a direction A orthogonal to the surface 124 and the bonded wire 13 overlaps the surface 126 in a view taken from a direction B orthogonal to the side surface 126. That is, the bonded wire 13 overlaps the surface 124 or the surface 126 from a side view perspective. In other words, the bonded wire 13 overlaps the inner wall of the opening 17 (the surface 124 or the surface 126) in a view taken from a direction substantially parallel to the surface 121 or the surface 122 of the substrate 12. Further, from the top view perspective, the bonded wire 13 overlaps the surface 122 of the substrate 12 and the surface 111 of the substrate 11.

As shown in FIG. 1, the encapsulant 15 (i.e., package body) covering or encapsulating the surface 111 of substrate 11, the surfaces 122, 124 and 126 of the substrate 12, the semiconductor devices 1111, 1112, 1113, 1114, 1115, 1221, 1222 and 1223 and the bonded wires 13. The encapsulant 15 may include molding compounds, such as a Novolac-based resin, an epoxy-based resin, a silicone-based resin, or other another suitable encapsulant; fillers such as silicon oxide fillers, may be included in the molding compound. In addition, the encapsulant 15 may include a molding underfill (MUF) or a capillary underfill (CUF).

FIG. 2A is a top view of a semiconductor device package 1 in accordance with an embodiment of the instant disclosure, and FIG. 2B illustrates a cross-sectional view along line X-X in FIG. 2A. Referring to FIG. 2A, the components 1221, 1222 and 1223 are mounted or disposed on the surface 122 of the substrate 12. Further, the openings 17 are respectively arranged adjacent to the corners of the substrate 12. The conductive wires 15 are adjacent to the openings 17. Further, the surfaces 124 and 126 of the substrate 12 are disposed on the surface 111 of the substrate 11 from a top view perspective. Moreover, as shown in FIG. 2A, since the substrate 12 has the openings 17 adjacent to its corners, the substrate 12 has a cross-sectional width D1 (which may be equal to a distance between the side surfaces 123 of the substrate 12) and a cross-sectional width D2 (which may be equal to a distance between the surfaces 124 of the substrate 12) and the cross-sectional width D1 is larger than the cross-sectional D2. In addition, in some embodiments of the present disclosure, the substrate 11 has a cross-sectional width D3 substantially equal to the cross-sectional width D1 of the substrate 12 since two side surfaces 123 of the substrate 12 are respectively coplanar with two side surfaces 113 of the substrate 11.

As shown in FIG. 2B, the substrate 11 further includes a surface 112 opposite to the surface 111. In some embodiments of the present disclosure, a number of the electrical connections 18 are mounted or disposed on the surface 112 of the substrate 11. The electrical connection 18 may include solder balls or solder bumps such as C4 bumps for connecting an external component such as a PCB. The substrate 12 further 12 includes a surface 121 opposite to the surface 122. In some embodiments of the present disclosure, a number of semiconductor devices 1211, 1212 and 1213 are mounted or disposed on the surface 121 of the substrate 12. The semiconductor devices 1211, 1212 and 1213 may be a die, an active device, a passive device, and/or other electronic devices. The semiconductor devices 1211, 1212 and 1213 may electrically connected to the substrate 12 via flip-chip bonding or wire bonding.

Referring to FIG. 2B, the surface 123 of the substrate 12 is substantially coplanar with the surface 113 of the substrate 11, and the surface 124 of the substrate 12 projects on the surface 111 of the substrate 11. Further, one end of the bonded wire 13 contacts the surface 122 of the substrate 12 and the other end of the bonded wire 13 contacts the surface 111 of the substrate 11, and the bonded wire 13 passes through the opening 17. From the top view perspective, the bonded wire 13 overlaps the surface 121 of the substrate 12 and the surface 111 of the substrate 11. Moreover, FIG. 2B clearly shows that the bonded wire 13 overlaps the surface 124 in a view taken from a direction orthogonal to the surface 124 and the bonded wire 13 overlaps the surface 126 in a view taken from a direction orthogonal to the side surface 126. Thus, the bonded wire 13 overlaps the surface 124 from the right side view perspective and the bonded wire 13 overlaps the surface 126 from the front side view perspective.

Figure 3A:
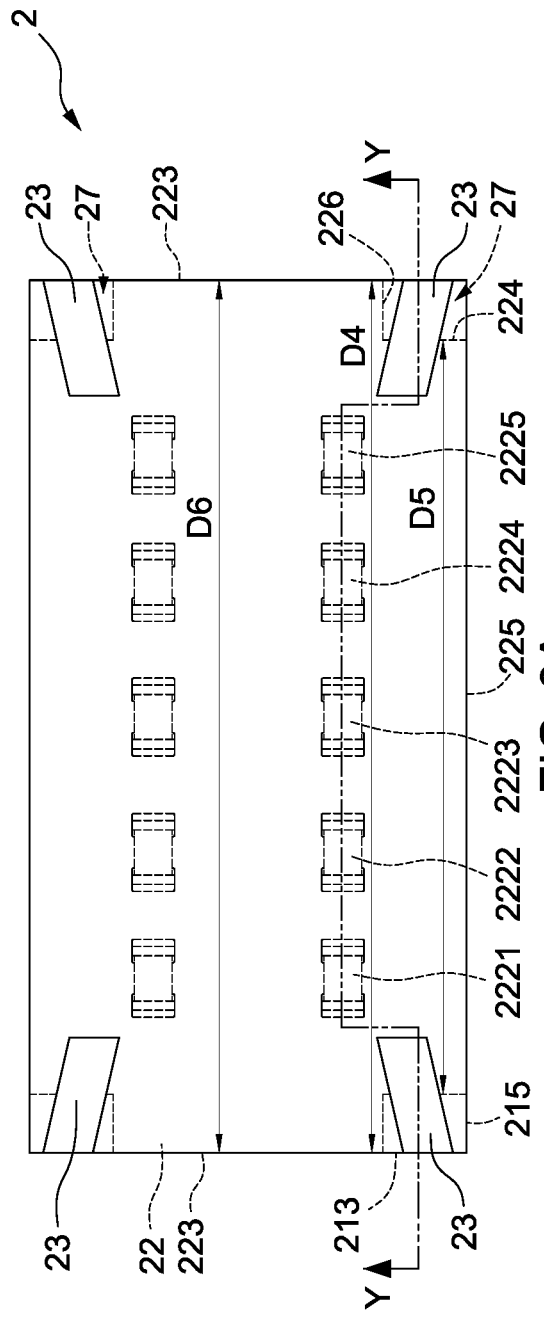
FIG. 3A is a top view of a semiconductor device package in accordance with an embodiment of the instant disclosure.
Figure 3B:
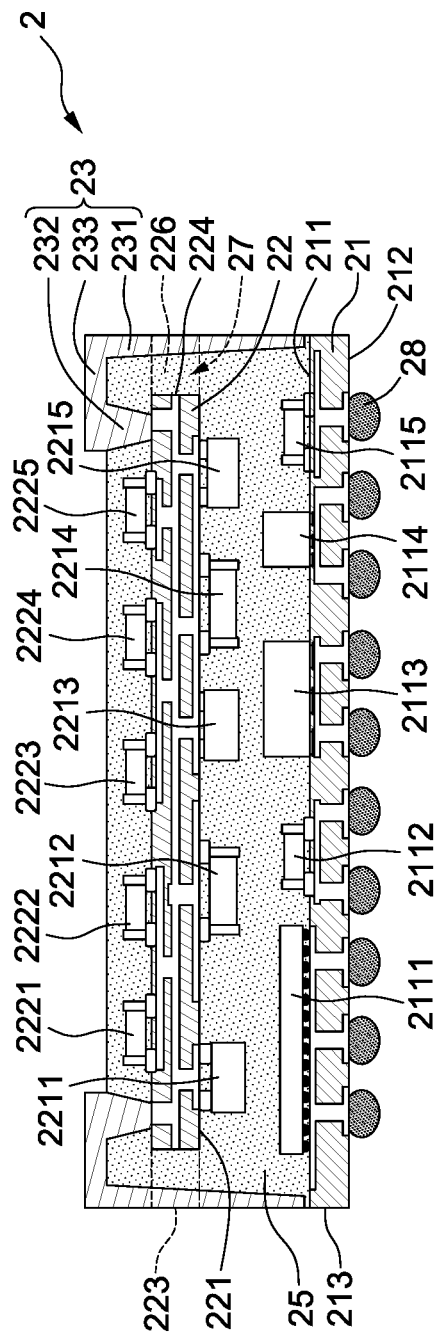
FIG. 3B illustrates a cross-sectional view along line Y-Y in FIG. 3A.

FIG. 3A is a top view of a semiconductor device package 2 in accordance with an embodiment of the instant disclosure, and FIG. 3B illustrates a cross-sectional view along line Y-Y in FIG. 3A. As shown in FIG. 3A and FIG. 3B, the semiconductor device package 2 includes substrates 21 and 22, semiconductor devices 2111, 2112, 2113, 2114, 2115, 2221, 2222, 2223, 2224, 2225, 2211, 2212, 2213, 2214 and 2215, vias 23, an encapsulant 25 and electric connections 28. In some embodiments, the substrate 21 may be a core substrate or a core-less substrate. The substrate 21 may include traces, pads or interconnections for electrical connection. The substrate 21 has a surface 211 and a surface 212 opposite to the surface 211. A number of the semiconductor devices 2111, 2112, 2113, 2114 and 2115 are disposed or mounted on the surface 211 of the substrate 21. The semiconductor devices 2111, 2112, 2113, 2114 and 2115 may be a die, an active device, a passive device, and/or other electronic devices. The semiconductor devices 2111, 2112, 2113, 2114 and 2115 may electrically connected to the substrate 21 via flip-chip bonding or wire bonding. Further, a number of the electrical connections 28 are mounted or disposed on the surface 212 of the substrate 21. The electrical connection 28 may include solder balls or solder bumps such as C4 bumps for connecting an external component such as a PCB.

In some embodiments, the substrate 22 may be a core substrate or a core-less substrate. The substrate 22 may include traces, pads or interconnections for electrical connection. The substrate 22 has a surface 221 facing the surface 211 of the substrate 21 and a surface 222 opposite to the surface 221. Thus, the substrate 22 is substantially arranged above the substrate 21. A number of the semiconductor devices 2211, 2212, 2213, 2214 and 2215 are disposed or mounted on the surface 221 of the substrate 22, and a number of the semiconductor devices 2221, 2222, 2223, 2224 and 2225 are disposed or mounted on the surface 222 of the substrate 22. The semiconductor devices 2211, 2212, 2213, 2214, 2215, 2221, 2222, 2223, 2224 and 2225 may be a die, an active device, a passive device, and/or other electronic devices. The semiconductor devices 2211, 2212, 2213, 2214, 2215, 2221, 2222, 2223, 2224 and 2225 may electrically connected to the substrate 22 via flip-chip bonding or wire bonding.

The substrate 21 has a surface 213 (e.g., a side surface) and the substrate 22 has a surface 223 (e.g., a side surface). In some embodiments of the present disclosure, the surface 213 and the surface 223 are coplanar with each other. The substrate 21 has a surface 215 (e.g., a front surface) and the substrate 22 has a surface 225 (e.g., a front surface). In some embodiments of the present disclosure, and the surface 215 and the surface 225 are coplanar with each other. In some embodiments of the present disclosure, the substrate 22 includes four openings 27 which are respectively adjacent to four corners of the substrate 22. Thus, the substrate 22 has a surface 224 connecting to the surface 225 and a surface 226 connecting to the surface 223. In some embodiments of the present disclosure, the surfaces 225 and 226 are connected to each other. In some embodiments of the present disclosure, the surfaces 224 and 226 are not coplanar with each other. The surfaces 224 and 226 are portions of the inner walls of the opening 27. In other words, the opening 27 includes the side surfaces 224 and 226. From a top view perspective, the surfaces 224 and 226 can be disposed on the surface 211 of the substrate 21.

In some embodiments of the present disclosure, the substrate 22 has a cross-sectional width D4 (which may be equal to a distance between the side surfaces 223 of the substrate 22) and a cross-sectional width D5 (which may be equal to a distance between the surfaces 224 of the substrate 22) and the cross-sectional width D4 is larger than the cross-sectional D5. In addition, in some embodiments of the present disclosure, the substrate 21 has a cross-sectional width D6 substantially equal to the cross-sectional width D3 of the substrate 22 since two side surfaces 223 of the substrate 22 are respectively coplanar with two side surfaces 213 of the substrate 21.

As shown in FIG. 3B, the encapsulant 25 (i.e., package body) covering or encapsulating the surface 211 of substrate 11, the surfaces 221, 222, 224 and 226 of the substrate 22 and the semiconductor devices 2111, 2112, 2113, 2114, 2115, 2211, 2212, 2213, 2214, 2215 2221, 2222, 2223, 2224 and 2225. The encapsulant 25 may include molding compounds, such as a Novolac-based resin, an epoxy-based resin, a silicone-based resin, or other another suitable encapsulant; fillers such as silicon oxide fillers, may be included in the molding compound. In addition, the encapsulant 25 may include a molding underfill (MUF) or a capillary underfill (CUF).

As shown in FIG. 3A and FIG. 3B, the via 23 is adjacent to the opening 27 and includes a first via 231 passing through the opening 27 and electrically connecting to the surface 211 of the substrate 21, a second via 232 electrically connecting the surface 222 of the substrate 22 and a bridge 233 arranged on an upper surface 253 of the encapsulant 25 and electrically connecting the first and second vias 231 and 232. Thus, the substrates 21 and 22 are electrically connected to each other by the via 23. In some embodiments of the present disclosure, referring to FIG. 3B, the first via 231 is tapered from its top end to its bottom end. Further, the first via 231 is spaced from the surfaces 224 of the substrate 22 and spaced from the surface 226 of the substrate. Thus, the via 23 passes through the opening 27 but does not contact the opening 27. Moreover, in some embodiments of the present disclosure, the second via 232 is tapered from its top end to its bottom end.

Referring to FIG. 3A and FIG. 3B, in a view taken from a direction orthogonal to the surface 224, the first via 231 overlaps the surface 224. Moreover, in a view taken from a direction orthogonal to the side surface 226, the first via 231 overlaps the surface 226. Thus, the via 23 overlaps the surface 224 from the right side view perspective, and the via 23 overlaps the surface 226 from the front side view perspective. In other words, the via 23 overlaps the inner wall of the opening 27 (the surface 224 or the surface 226) in a view taken from a direction substantially parallel to the surface 221 or the surface 222 of the substrate 22. Referring to FIGS. 3A and 3B, the via 23 overlaps the surface 221 of the substrate 22 and the surface 211 of the substrate 21 from the top view perspective.

FIG. 4A is a top view of a semiconductor device package 3 in accordance with an embodiment of the instant disclosure, and FIG. 4B illustrates a cross-sectional view along line Z-Z in FIG. 4A. As shown in FIG. 4A and FIG. 4B, the semiconductor device package 3 includes substrates 31 and 32, semiconductor devices 3111, 3112, 3113, 3114, 3115, 3221, 3222, 3223, 3224, 3225, 3211, 3212, 3213, 3214 and 3215, vias 33, an encapsulant 35 and electric connections 38. In some embodiments, the substrate 31 may be a core substrate or a core-less substrate. The substrate 31 may include traces, pads or interconnections for electrical connection. The substrate 31 has a surface 311 and a surface 312 opposite to the surface 311. A number of the semiconductor devices 3111, 3112, 3113, 3114 and 3115 are disposed or mounted on the surface 311 of the substrate 31. The semiconductor devices 3111, 3112, 3113, 3114 and 3115 may be a die, an active device, a passive device, and/or other electronic devices. The semiconductor devices 3111, 3112, 3113, 3114 and 3115 may electrically connected to the substrate 31 via flip-chip bonding or wire bonding. Further, a number of the electrical connections 38 are mounted or disposed on the surface 312 of the substrate 31. The electrical connection 38 may include solder balls or solder bumps such as C4 bumps for connecting an external component such as a PCB.

In some embodiments, the substrate 32 may be a core substrate or a core-less substrate. The substrate 32 may include traces, pads or interconnections for electrical connection. The substrate 32 has a surface 321 facing the surface 311 of the substrate 31 and a surface 322 opposite to the surface 321. Thus, the substrate 32 is substantially arranged above the substrate 31. A number of the semiconductor devices 3211, 3212, 3213, 3214 and 3215 are disposed or mounted on the surface 321 of the substrate 32, and a number of the semiconductor devices 3221, 3222, 3223, 3224 and 3225 are disposed or mounted on the surface 322 of the substrate 32. The semiconductor devices 3211, 3212, 3213, 3214, 2215, 3221, 3222, 3223, 3224 and 3225 may be a die, an active device, a passive device, and/or other electronic devices. The semiconductor devices 3211, 3212, 3213, 3214, 2215, 3221, 3222, 3223, 3224 and 3225 may electrically connected to the substrate 32 via flip-chip bonding or wire bonding.

The substrate 31 has a surface 313 (e.g., a side surface) and the substrate 32 has a surface 325 (e.g., a front surface) and a surface 323 (e.g., a side surface). In some embodiments of the present disclosure, the surface 313 and the surface 323 are coplanar with each other. In some embodiments of the present disclosure, the substrate 32 includes four openings 37 which are respectively adjacent to four corners of the substrate 32. Thus, the substrate 32 has a surface 324 connecting to the surface 325 and a surface 326 connecting to the surface 323. In some embodiments of the present disclosure, the surfaces 324 and 326 are connected to each other. In some embodiments of the present disclosure, the surfaces 324 and 326 are not coplanar with each other. The surfaces 324 and 326 are portions of the inner walls of the opening 37. In other words, the opening 37 includes the side surfaces 324 and 326. From a top view perspective, the surfaces 324 and 326 can be disposed on the surface 311 of the substrate 31.

In some embodiments of the present disclosure, the substrate 32 has a cross-sectional width D7 (which may be equal to a distance between the side surfaces 323 of the substrate 32) and a cross-sectional width D8 (which may be equal to a distance between the surfaces 324 of the substrate 32) and the cross-sectional width D7 is larger than the cross-sectional D8. In addition, in some embodiments of the present disclosure, the substrate 31 has a cross-sectional width D9 substantially equal to the cross-sectional width D7 of the substrate 32 since two side surfaces 323 of the substrate 32 are respectively coplanar with two side surfaces 313 of the substrate 31.

As shown in FIG. 4B, the encapsulant 35 (i.e., package body) covering or encapsulating the surface 311 of substrate 31, the surfaces 321, 322 of the substrate 32 and the semiconductor devices 3111, 3112, 3113, 3114, 3115, 3211, 3212, 3213, 3214, 3215 3221, 3222, 3223, 3224 and 3225. The encapsulant 35 may include molding compounds, such as a Novolac-based resin, an epoxy-based resin, a silicone-based resin, or other another suitable encapsulant; fillers such as silicon oxide fillers, may be included in the molding compound. In addition, the encapsulant 35 may include a molding underfill (MUF) or a capillary underfill (CUF).

As shown in FIG. 4A, the vias 33 are arranged adjacent to the openings of the substrate 32. Further, as shown in FIG. 4B, the via 33 extends from the upper surface 353 of the encapsulant 35 to the surface 311 of the substrate 31 and passes through the opening 37. Referring to FIG. 4A and FIG. 4B, the via 33 contacts the surfaces 324 and 326 of the substrate 32 and thus electrically connects to the substrate 32. Referring to FIG. 4B, the via 33 contacts the surface 311 of the substrate 31 and thus electrically connects to the substrate 31. Therefore, the substrates 31 and 32 are electrically connected to each other by the via 33. In some embodiments of the present disclosure, referring to FIG. 4B, the via 33 is tapered from its top end to its bottom end. In addition, in some embodiments of the present disclosure, an upper surface 331 of the via 33 is exposed from the upper surface 353 of the encapsulant 35.

Referring to FIG. 4A and FIG. 4B, in a view taken from a direction orthogonal to the surface 324, the via 33 overlaps the surface 324. Moreover, in a view taken from a direction orthogonal to the side surface 326, the via 33 overlaps the surface 326. Thus, the via 33 overlaps the surface 324 from the right side view perspective, and the via 33 overlaps the surface 326 from the front side view perspective. In other words, the via 33 overlaps the inner wall of the opening 37 (the surface 324 or the surface 326) in a view taken from a direction substantially parallel to the surface 321 or the surface 322 of the substrate 32. Referring to FIGS. 4A and 4B, the via 33 overlaps the surface 321 of the substrate 32 and the surface 311 of the substrate 31 from the top view perspective.

FIG. 5A, FIG. 5B, FIG. 5C, FIG. 5D, FIG. 5E, FIG. 5F, FIG. 5G, FIG. 5H, FIG. 5I and FIG. 5J illustrate a method for manufacturing a semiconductor device package 4 in accordance with some embodiments of the present disclosure.

Figure 5A:
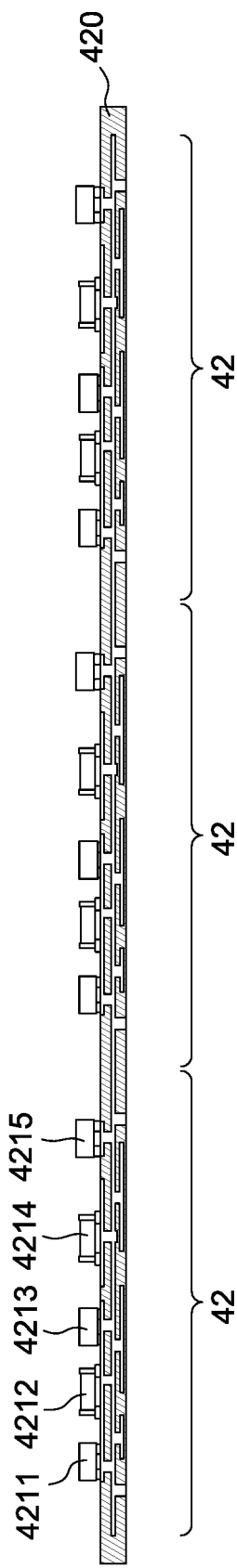

Referring to FIG. 5A, a strip substrate 420 may include a number of substrates 42. In some embodiments of the present disclosure, the strip substrate 420 may consist of a number of the substrates 42. A number of the semiconductor devices 4211, 4212, 4213, 4214 and 4215 are disposed on a surface 4201 of the strip substrate 420 and electrically connected to the strip substrate 420.

Figure 5B:
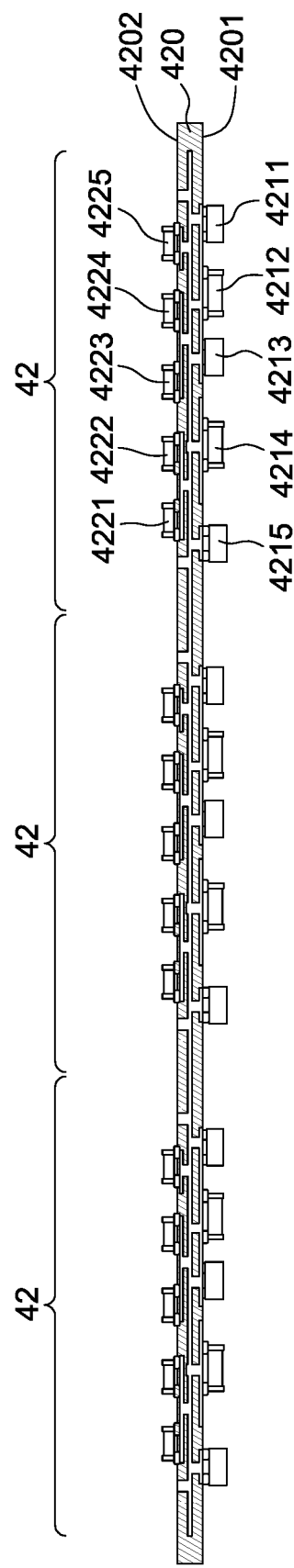

Referring to FIG. 5B, a number of the semiconductor devices 4221, 4222, 4223, 4224 and 4225 are disposed on a surface 4202 of the strip substrate 420 and electrically connected to the strip substrate 420. The surface 4202 of the substrate 420 is opposite to the surface 4201 of the substrate 420.

Figure 5C:
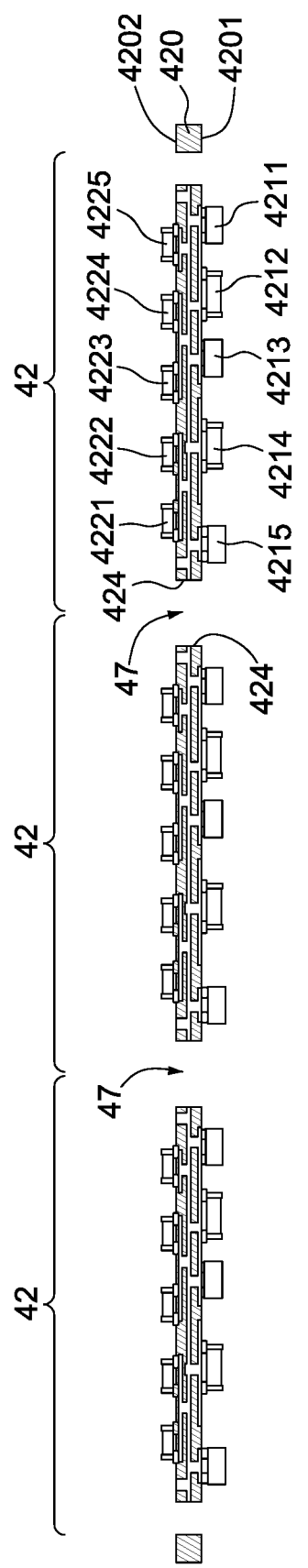

Referring to FIG. 5C, portions of the strip substrate 420 are removed so as to form a number of the openings 47 passing through the strip substrate 420. In some embodiments of the present disclosure, the openings 47 are formed by a laser drilling process. In some embodiments of the present disclosure, the opening 47 is substantially located at an interface between two adjacent substrates 42. In other words, the opening 47 may be substantially located between two adjacent substrates 42. That is, the opening 47 causes the side surfaces 424 of the two adjacent substrates 42 to be exposed.

Figure 5D:
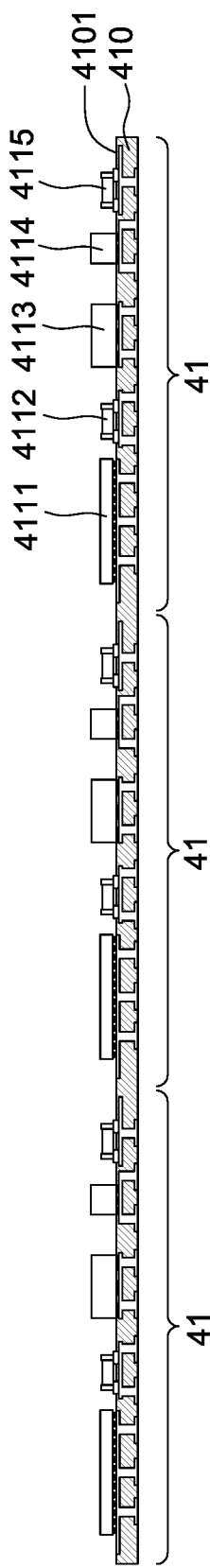

Referring to FIG. 5D, a strip substrate 410 may include a number of substrates 41. In some embodiments of the present disclosure, the strip substrate 410 may consist of a number of the substrates 41. A number of the semiconductor devices 4111, 4112, 4113, 4114 and 4115 are disposed on a surface 4101 of the strip substrate 410 and electrically connected to the strip substrate 410.

Figure 5E:
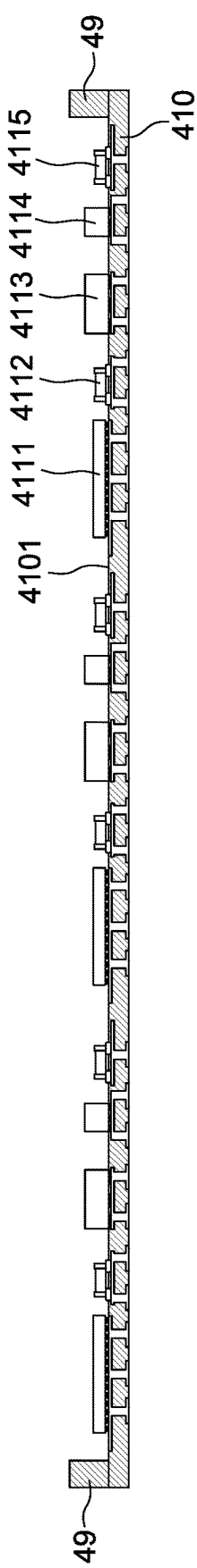

Referring to. FIG. 5E, a number of the supports 49 are arranged on the surface 4101 of the strip substrate 410.

Figure 5F:
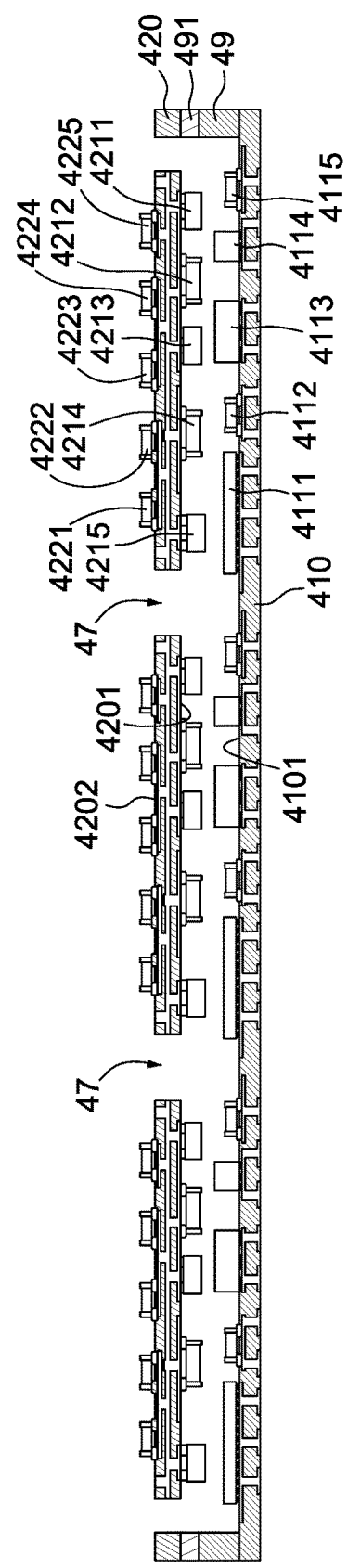

Referring to FIG. 5F, the strip substrate 420 is mounted to the supports 49 such that the strip substrate 420 is stacked above the strip substrate 410. In some embodiments of the present disclosure, a tape 491 is arranged between the support 49 and the strip substrate 420. As shown in FIG. 5F, the surface 4201 of the strip substrate 420 faces the surface 4101 of the strip substrate 410, and the surface 4202 of the strip substrate 420 faces away from the surface 4101 of the strip substrate 410.

Referring to FIG. 5G, a number of the bonded wires 43 are formed to connect the strip substrates 410 and 420. In some embodiments of the present disclosure, these bonded wires 43 are formed by wire bonding process. As shown in FIG. 5G, the bonded wire passes through the opening 47, and one end of the bonded wire 43 electrically connects to the surface 4202 of the strip substrate 420 and the other end of the bonded wire 43 electrically connects to the surface 4101 of the strip substrate 410.

Referring to FIG. 5H, an encapsulant 45 is disposed on the strip substrates 410 and 420 and encapsulates the surfaces 4201, 4202 of the strip substrate 420, the semiconductor devices 4221, 4222, 4223, 4224 and 4225 on the surface 4202 of the strip substrate 420, the semiconductor devices 4211, 4212, 4213, 4214 and 4215 on the surface 4201 of the strip substrate 420, the surface 4101 of the strip substrate 410, the semiconductor devices 4111, 4112, 4113, 4114 and 4115 on the surface 4101 of the strip substrate 410, the openings 47 and the bonded wires 43.

Figure 5I:
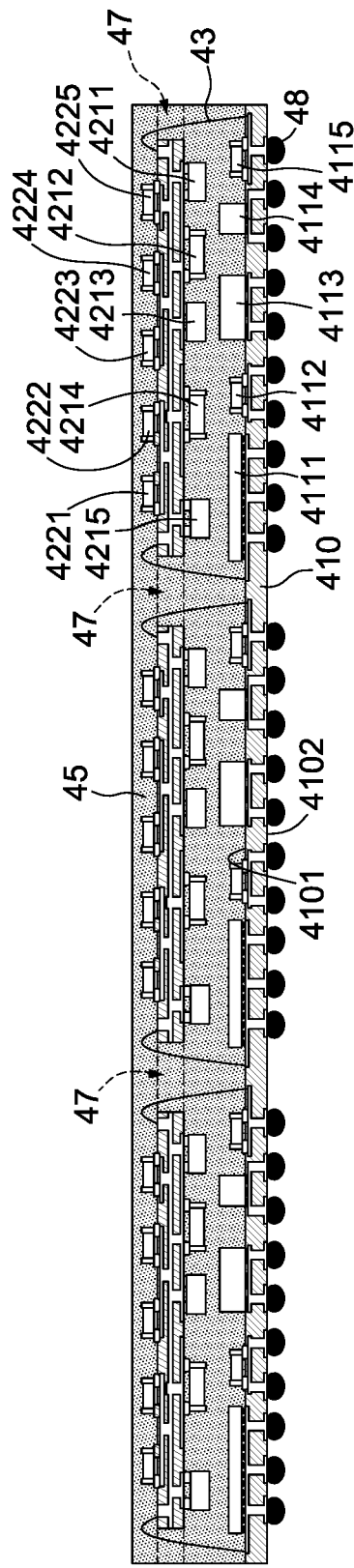

Referring to FIG. 5I, a number of the electric connections 48 are mounted to a surface 4102 of the strip substrate 410 and electrically connect to the strip substrate 410. The surface 4102 of the strip substrate 410 is opposite to the surface 4101 of the strip substrate 410.

Figure 5J:
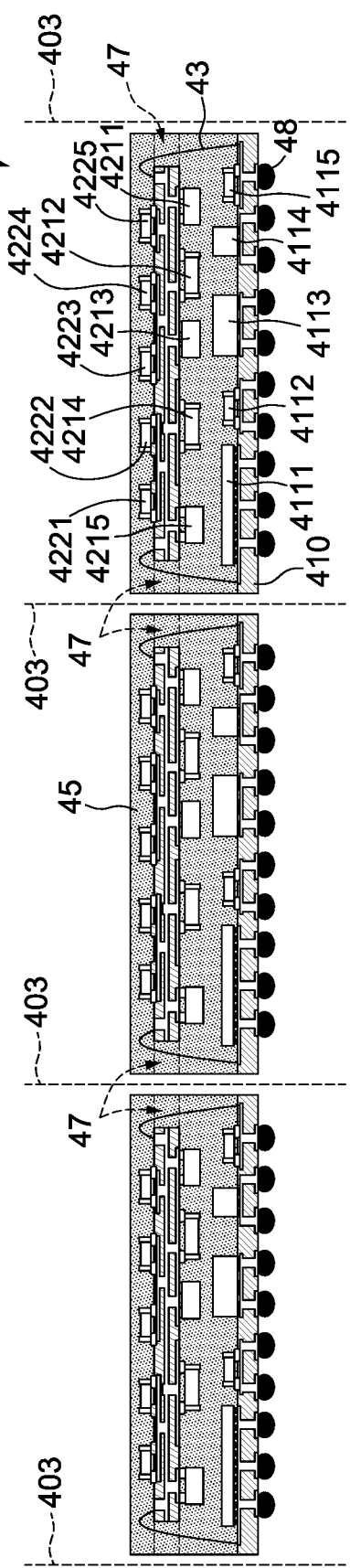

Referring to FIG. 5J, a singulation process is performed by cutting through the encapsulant 43 and the strip substrates 410 and 420. The singulation may be performed, for example, by using a dicing saw, laser or other appropriate cutting technique. In some embodiments of the present disclosure, the singulation process may be achieved along a cut path 403 and the cut path 403 may substantially pass through the opening 47. After the singulation process, the strip substrate 410 is divided into a number of the substrates 41, and the strip substrate 420 is divided into a number of the substrates 42.

After the manufacturing process as shown in FIG. 5A, FIG. 5B, FIG. 5C, FIG. 5D, FIG. 5E, FIG. 5F, FIG. 5G, FIG. 5H, FIG. 5I and FIG. 5J, the semiconductor device package 4 is formed (see FIG. 5J). In some embodiments, the semiconductor device package 4 is the same as, or similar to, the semiconductor device package 1 shown in FIG. 2A and FIG. 2B.

FIG. 6A, FIG. 6B, FIG. 6C, FIG. 6D, FIG. 6E, FIG. 6F, FIG. 6G, FIG. 6H and FIG. 6I illustrate a method for manufacturing a semiconductor device package 5 in accordance with some embodiments of the present disclosure.

Figure 6A:
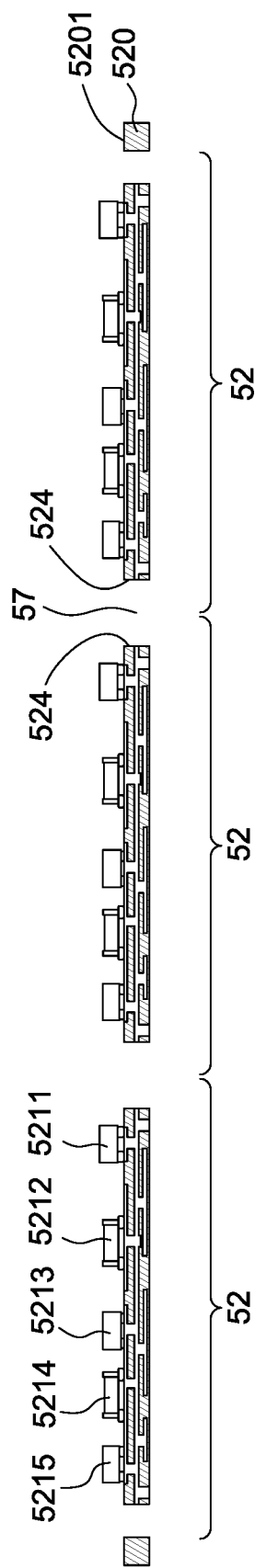

Referring to FIG. 6A, a strip substrate 520 may include a number of substrates 52. In some embodiments of the present disclosure, the strip substrate 520 may consist of a number of the substrates 52. A number of the semiconductor devices 5211, 5212, 5213, 5214 and 5215 are disposed on a surface 5201 of the strip substrate 520 and electrically connected to the strip substrate 520. Moreover, the strip substrate 520 further includes a number of openings 57 passing through the strip substrate 520. In some embodiments of the present disclosure, the opening 57 is substantially located at an interface between two adjacent substrates 52. In other words, the opening 57 may be substantially located between two adjacent substrates 52. That is, the opening 57 causes the side surfaces 524 of the two adjacent substrates 52 to be exposed.

Figure 6B:
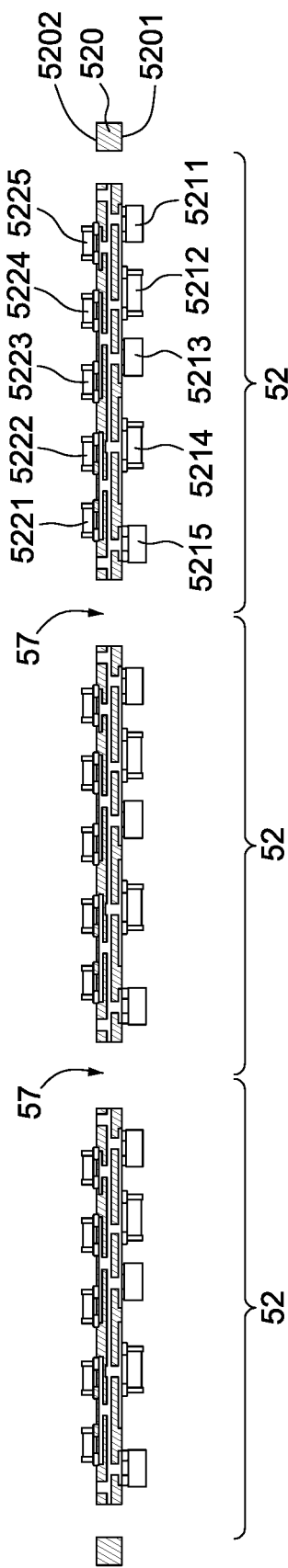

Referring to FIG. 6B, a number of the semiconductor devices 5221, 5222, 5223, 5224 and 5225 are disposed on a surface 5202 of the strip substrate 520 and electrically connected to the strip substrate 520. The surface 5202 of the strip substrate 520 is opposite to the surface 5201 of the strip substrate 520.

Figure 6C:
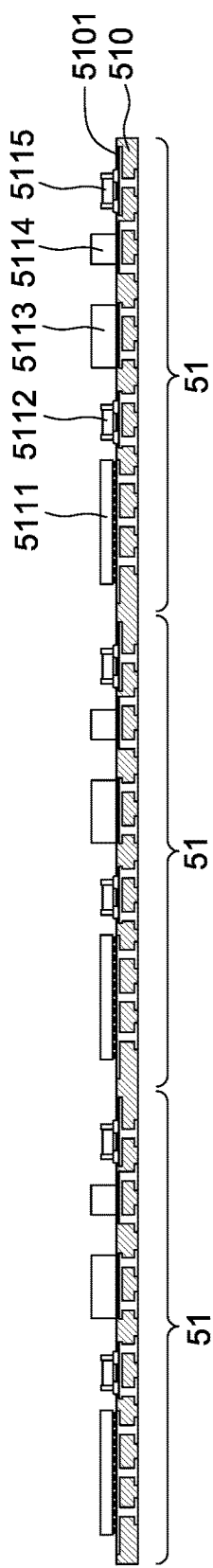

Referring to FIG. 6C, a strip substrate 510 may include a number of substrates 51. In some embodiments of the present disclosure, the strip substrate 510 may consist of a number of the substrates 51. A number of the semiconductor devices 5111, 5112, 5113, 5114 and 5115 are disposed on a surface 5101 of the strip substrate 510 and electrically connected to the strip substrate 510.

Figure 6D:
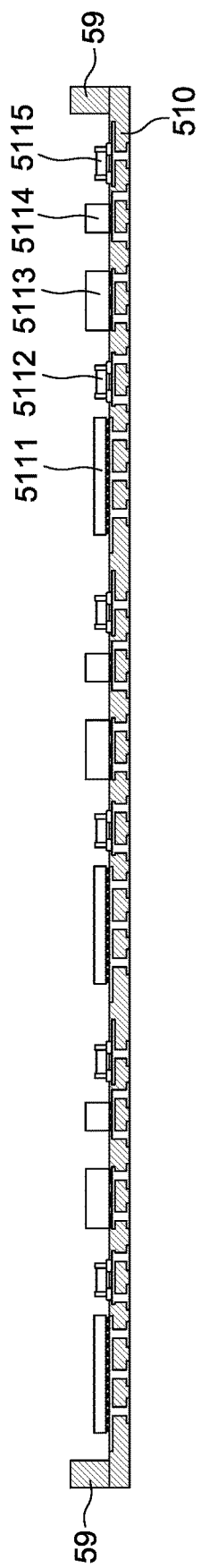

Referring to. FIG. 6D, a number of the supports 59 are arranged on the surface 5101 of the strip substrate 510.

Figure 6E:
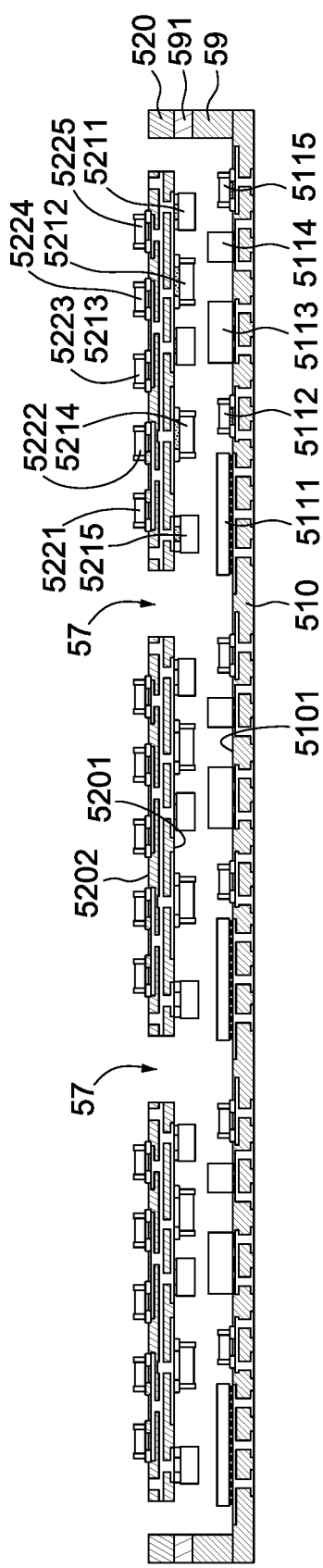

Referring to FIG. 6E, the strip substrate 520 is mounted to the supports 59 such that the strip substrate 520 is stacked above the strip substrate 510. In some embodiments of the present disclosure, a tape 591 is arranged between the support 59 and the strip substrate 520. As shown in FIG. 6E, the surface 5201 of the strip substrate 520 faces the surface 5101 of the strip substrate 510, and the surface 5202 of the strip substrate 520 faces away from the surface 5101 of the strip substrate 510.

Figure 6F:
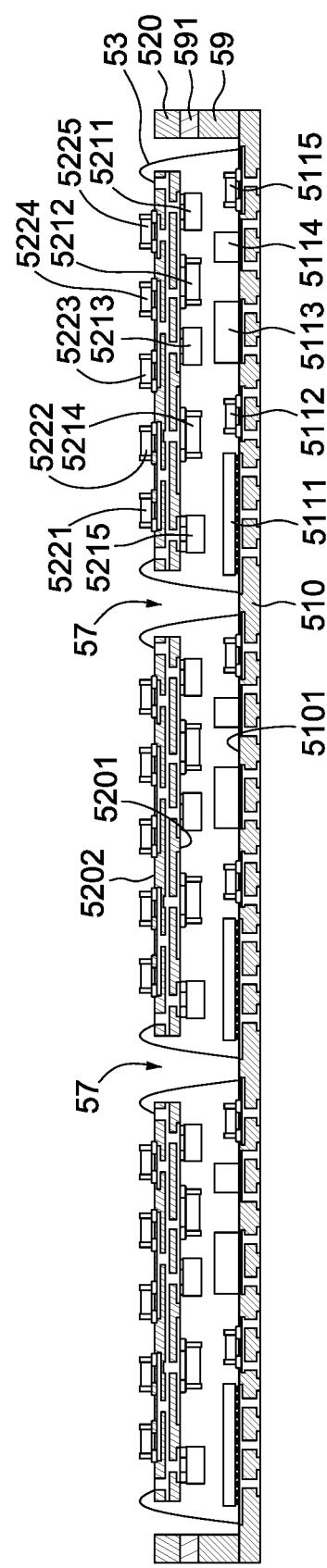

Referring to FIG. 6F, a number of the bonded wires 53 are formed to connect the strip substrates 510 and 520. In some embodiments of the present disclosure, these bonded wires 53 are formed by wire bonding process. As shown in FIG. 6F, the bonded wire passes through the opening 57, and one end of the bonded wire 53 electrically connects to the surface 5202 of the strip substrate 520 and the other end of the bonded wire 53 electrically connects to the surface 5101 of the strip substrate 510.

Figure 6G:
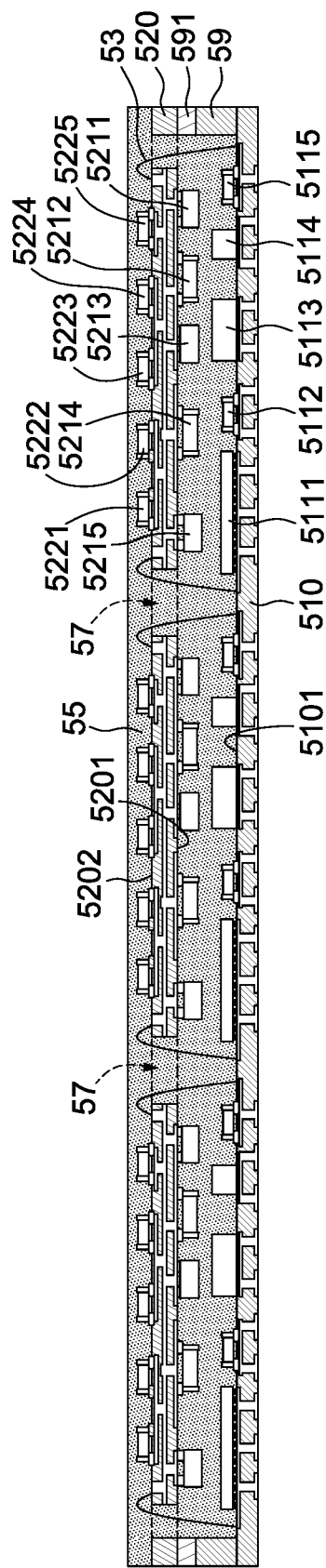

Referring to FIG. 6G, an encapsulant 55 is disposed on the strip substrates 510 and 520 and encapsulates the surfaces 5201, 5202 of the strip substrate 520, the semiconductor devices 5221, 5222, 5223, 5224 and 5225 on the surface 5202 of the strip substrate 520, the semiconductor devices 5211, 5212, 5213, 5214 and 5215 on the surface 5201 of the strip substrate 520, the surface 5101 of the strip substrate 510, the semiconductor devices 5111, 5112, 5113, 5114 and 5115 on the surface 5101 of the strip substrate 510, the openings 57 and the bonded wires 53.

Figure 6H:
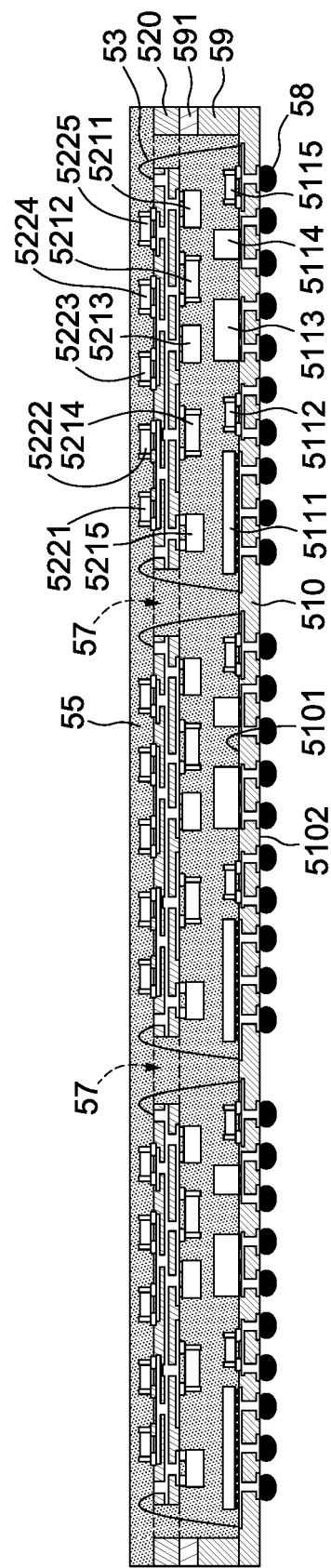

Referring to FIG. 6H, a number of the electric connections 58 are mounted to a surface 5102 of the strip substrate 510 and electrically connect to the strip substrate 510. The surface 5102 of the strip substrate 510 is opposite to the surface 5101 of the strip substrate 510.

Referring to FIG. 6I, a singulation process is performed by cutting through the encapsulant 53 and the strip substrates 510 and 520. The singulation may be performed, for example, by using a dicing saw, laser or other appropriate cutting technique. In some embodiments of the present disclosure, the singulation process may be achieved along a cut path 503 and the cut path 503 may substantially pass through the opening 57. After the singulation process, the strip substrate 510 is divided into a number of the substrates 51, and the strip substrate 520 is divided into a number of the substrates 52.

After the manufacturing process as shown in FIG. 6A, FIG. 6B, FIG. 6C, FIG. 6D, FIG. 6E, FIG. 6F, FIG. 6G, FIG. 6H and FIG. 6I, the semiconductor device package 5 is formed (see FIG. 6I). In some embodiments, the semiconductor device package 5 is the same as, or similar to, the semiconductor device package 1 shown in FIG. 2A and FIG. 2B.

FIG. 7A, FIG. 7B, FIG. 7C, FIG. 7D, FIG. 7E, FIG. 7F, FIG. 7G, FIG. 7H, FIG. 7I, FIG. 7J and FIG. 7K illustrate a method for manufacturing a semiconductor device package 6 in accordance with some embodiments of the present disclosure.

Referring to FIG. 7A, a strip substrate 620 may include a number of substrates 62. In some embodiments of the present disclosure, the strip substrate 620 may consist of a number of the substrates 62. A number of the semiconductor devices 6211, 6212, 6213, 6214 and 6215 are disposed on a surface 6201 of the strip substrate 620 and electrically connected to the strip substrate 620.

Figure 7B:
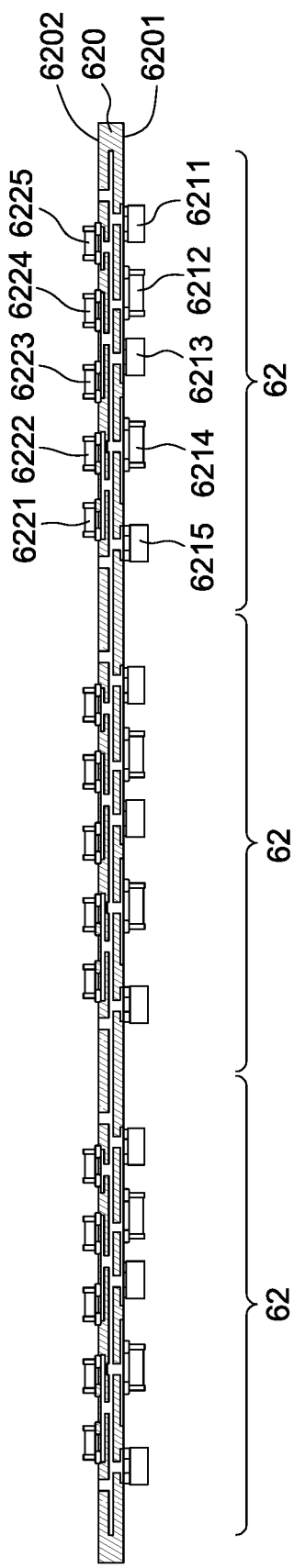

Referring to FIG. 7B, a number of the semiconductor devices 6221, 6222, 6223, 6224 and 6225 are disposed on a surface 6202 of the strip substrate 620 and electrically connected to the strip substrate 620. The surface 6202 of the substrate 620 is opposite to the surface 6201 of the substrate 620.

Figure 7C:
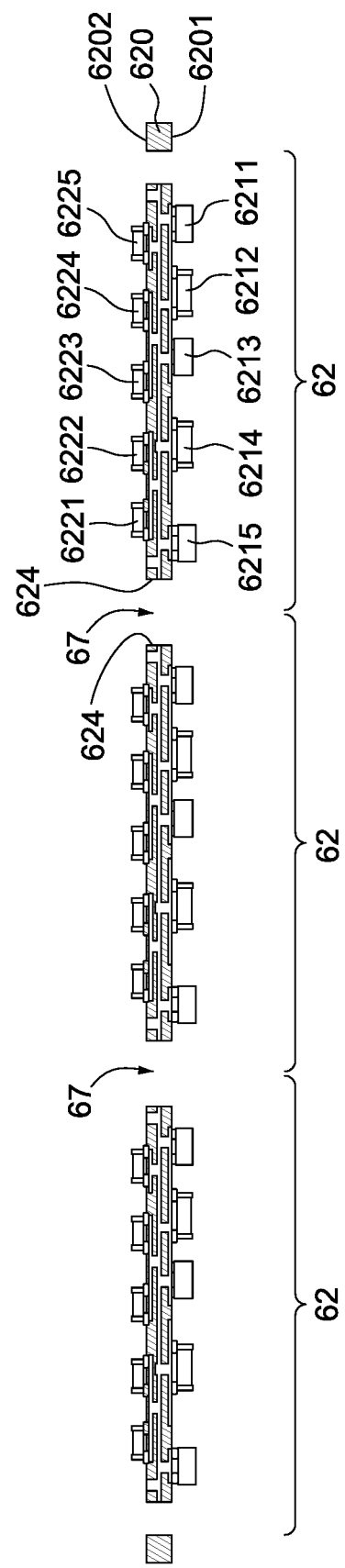

Referring to FIG. 7C, portions of the strip substrate 620 are removed so as to form a number of the openings 67 passing through the strip substrate 620. In some embodiments of the present disclosure, the openings 67 are formed by a laser drilling process. In some embodiments of the present disclosure, the opening 67 is substantially located at an interface between two adjacent substrates 62. In other words, the opening 67 may be substantially located between two adjacent substrates 62. That is, the opening 67 causes the side surfaces 624 of the two adjacent substrates 62 to be exposed.

Figure 7D:
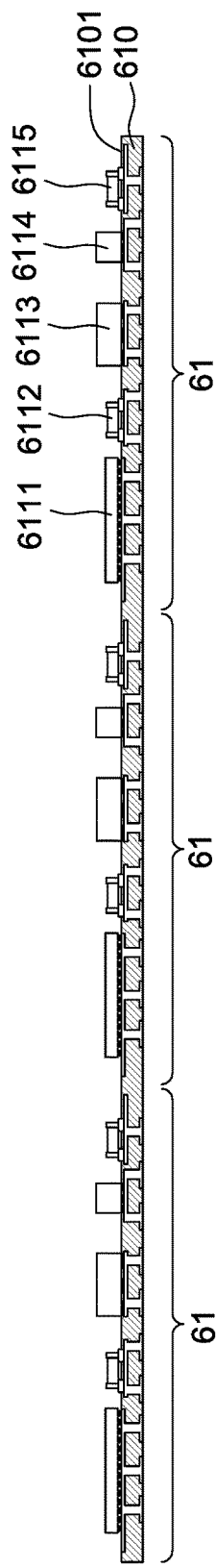

Referring to FIG. 7D, a strip substrate 610 may include a number of substrates 61. In some embodiments of the present disclosure, the strip substrate 610 may consist of a number of the substrates 61. A number of the semiconductor devices 6111, 6112, 6113, 6114 and 6115 are disposed on a surface 6101 of the strip substrate 610 and electrically connected to the strip substrate 610.

Figure 7E:
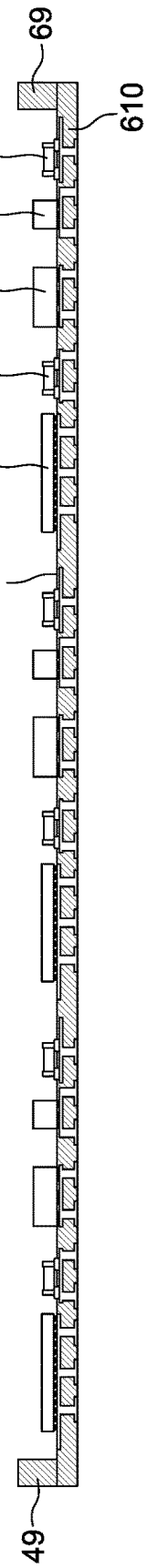

Referring to. FIG. 7E, a number of the supports 69 are arranged on the surface 6101 of the strip substrate 610.

Figure 7F:
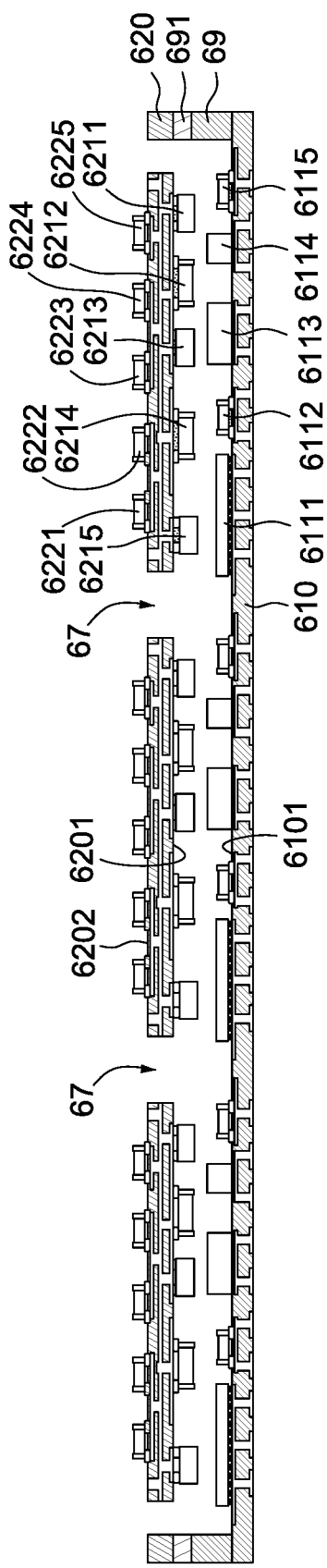

Referring to FIG. 7F, the strip substrate 620 is mounted to the supports 69 such that the strip substrate 620 is stacked above the strip substrate 610. In some embodiments of the present disclosure, a tape 691 is arranged between the support 69 and the strip substrate 620. As shown in FIG. 6F, the surface 6201 of the strip substrate 620 faces the surface 6101 of the strip substrate 610, and the surface 6202 of the strip substrate 620 faces away from the surface 6101 of the strip substrate 610.

Figure 7G:
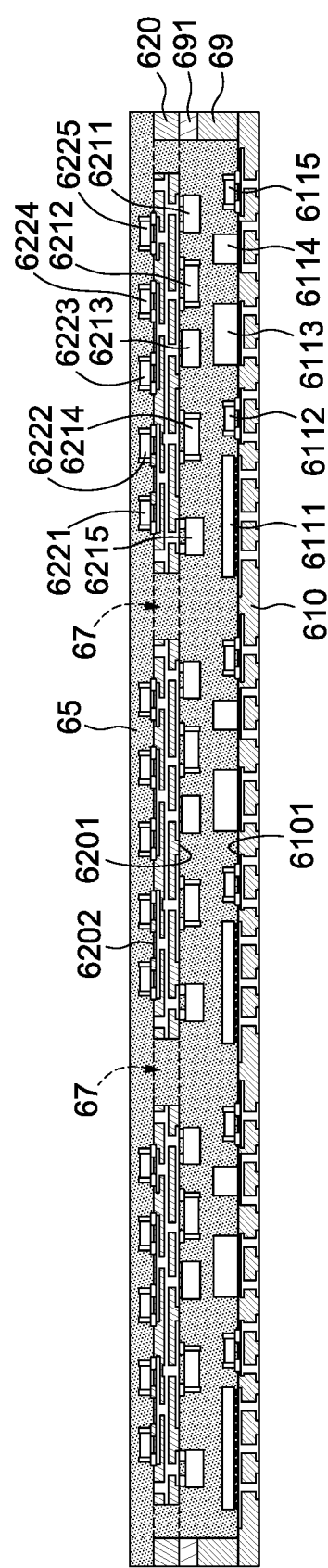

Referring to FIG. 7G, an encapsulant 65 is disposed on the strip substrates 610 and 620 and encapsulates the surfaces 6201, 6202 of the strip substrate 620, the semiconductor devices 6221, 6222, 6223, 6224 and 6225 on the surface 6202 of the strip substrate 620, the semiconductor devices 6211, 6212, 6213, 6214 and 6215 on the surface 6201 of the strip substrate 620, the surface 6101 of the strip substrate 610, the semiconductor devices 6111, 6112, 6113, 6114 and 6115 on the surface 6101 of the strip substrate 610, and the openings 67.

Figure 7H:
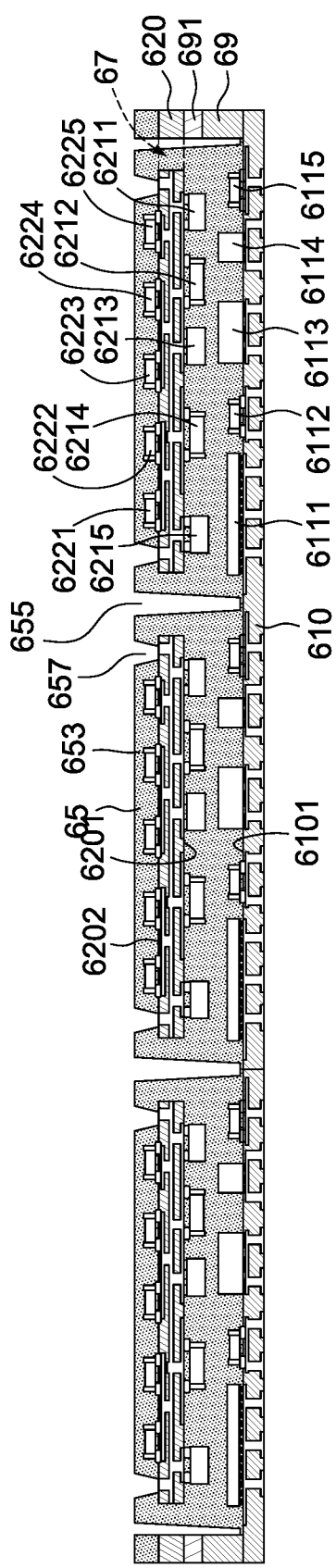

Referring to FIG. 7H, portions of the encapsulant 65 are removed by a laser process and thus portions of the surface 6101 of the strip substrate 610 and portions of the surface 6202 of the strip substrate 620 are exposed. As shown in FIG. 7H, after the portions of the encapsulant 65 are removed, the encapsulant 65 includes a number of the through holes 655 and a number of the through holes 657. The through hole 655 extends from an upper surface 653 of the encapsulant 65 to the surface 6101 of the strip substrate 610. Thus, a portion of the surface 6101 of the strip substrate 610 is exposed. Moreover, the through hole 655 passes through the opening 67. In some embodiments of the present disclosure, the through hole 655 is tapered from a top end to a bottom end thereof. Further, the through hole 657 extends from the upper surface 653 of the encapsulant 65 to the surface 6202 of the strip substrate 620. Thus, a portion of the surface 6202 of the strip substrate 620 is exposed. In some embodiments of the present disclosure, the through hole 657 is tapered from a top end to a bottom end thereof. In some embodiments of the present disclosure, the through hole 657 is adjacent to the through hole 655.

Figure 7I:
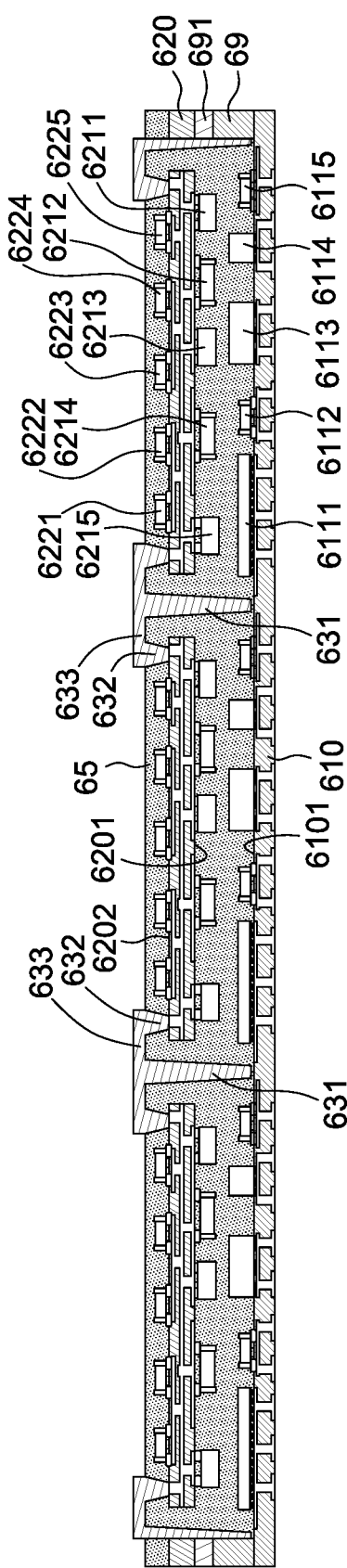

Referring to FIG. 7I, a plurality of vias 631 are formed in the through holes 655 and a plurality of vias 632 are formed in the through holes 657, and a plurality of bridges 633 are formed to electrically connect the vias 631 and vias 632. As shown in FIG. 7I, the via 631 is formed in the through hole 655 and contacts the surface 6101 of the strip substrate 610. Thus, the via 631 may extend from the upper surface 653 of the encapsulant 63 to the surface 6101 of the strip substrate 610 and pass through the opening 67. Thus, the via 631 electrically connects to the strip substrate 610. In some embodiments of the present disclosure, the via 631 is tapered from a top end to a bottom end thereof. Further, the via 632 is formed in the through hole 657 and contacts the surface 6202 of the strip substrate 620. Thus, the via 632 may extend from the upper surface 653 of the encapsulant 63 to the surface 6202 of the strip substrate 620. Thus, the via 632 electrically connects to the strip substrate 620. In some embodiments of the present disclosure, the via 632 is tapered from a top end to a bottom end thereof. Further, the bridge 633 is formed on the upper surface 633 of the encapsulant 63. One end of the bridge 633 connects to the via 631 and the other end of the bridge 633 connects to the via 632. Thus, the via 631 and the via 632 can electrically connect to each other by the bridge 633.

Figure 7J:
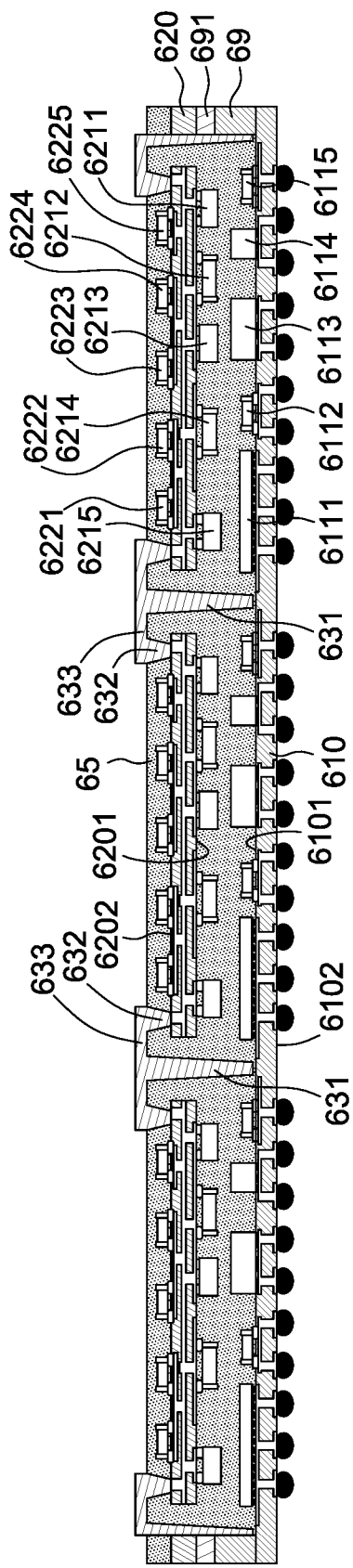

Referring to FIG. 7J, a number of the electric connections 68 are mounted to a surface 6102 of the strip substrate 610 and electrically connect to the strip substrate 610. The surface 6102 of the strip substrate 610 is opposite to the surface 6101 of the strip substrate 610.

Figure 7K:
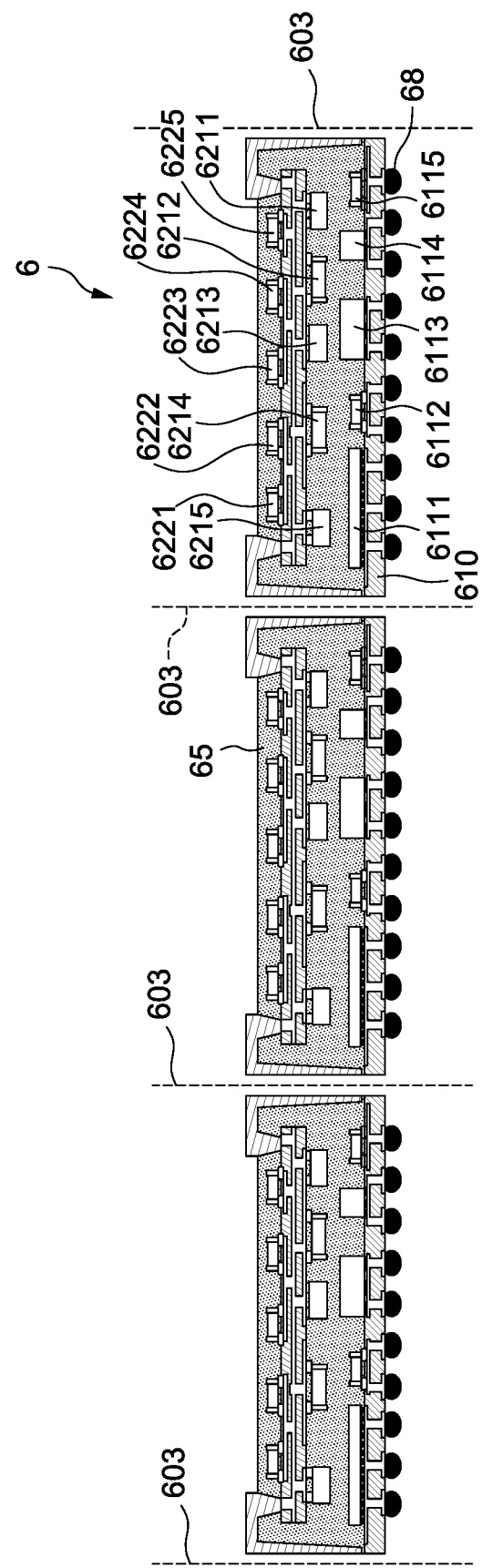

Referring to FIG. 7K, a singulation process is performed by cutting through the via 631 and the strip substrates 610 and 620. The singulation may be performed, for example, by using a dicing saw, laser or other appropriate cutting technique. In some embodiments of the present disclosure, the singulation process may be achieved along a cut path 603 and the cut path 603 may substantially pass through the opening 67. After the singulation process, the strip substrate 610 is divided into a number of the substrates 61, and the strip substrate 620 is divided into a number of the substrates 62. Moreover, the cut path 603 may substantially pass through the via 631 as well, and thus the via 631 may have a side surface exposed from the encapsulant 65 after the singulation process.

After the manufacturing process as shown in FIG. 7A, FIG. 7B, FIG. 7C, FIG. 7D, FIG. 7E, FIG. 7F, FIG. 7G, FIG. 7H, FIG. 7I, FIG. 7J and FIG. 7K, the semiconductor device package 6 is formed (see FIG. 7K). In some embodiments, the semiconductor device package 6 is the same as, or similar to, the semiconductor device package 2 shown in FIG. 3A and FIG. 3B.

FIG. 8A, FIG. 8B, FIG. 8C, FIG. 8D, FIG. 8E, FIG. 8F, FIG. 8G, FIG. 8H, FIG. 8I and FIG. 8J illustrate a method for manufacturing a semiconductor device package 7 in accordance with some embodiments of the present disclosure.

Referring to FIG. 8A, a strip substrate 720 may include a number of substrates 72. In some embodiments of the present disclosure, the strip substrate 720 may consist of a number of the substrates 72. A number of the semiconductor devices 7211, 7212, 7213, 7214 and 7215 are disposed on a surface 7201 of the strip substrate 720 and electrically connected to the strip substrate 720. Moreover, the strip substrate 720 further includes a number of openings 77 passing through the strip substrate 720. In some embodiments of the present disclosure, the opening 77 is substantially located at an interface between two adjacent substrates 72. In other words, the opening 77 may be substantially located between two adjacent substrates 72. That is, the opening 77 causes the side surfaces 724 of the two adjacent substrates 72 to be exposed.

Referring to FIG. 8B, a number of the semiconductor devices 7221, 7222, 7223, 7224 and 7225 are disposed on a surface 7202 of the strip substrate 720 and electrically connected to the strip substrate 720. The surface 7202 of the strip substrate 720 is opposite to the surface 7201 of the strip substrate 720.

Figure 8C:
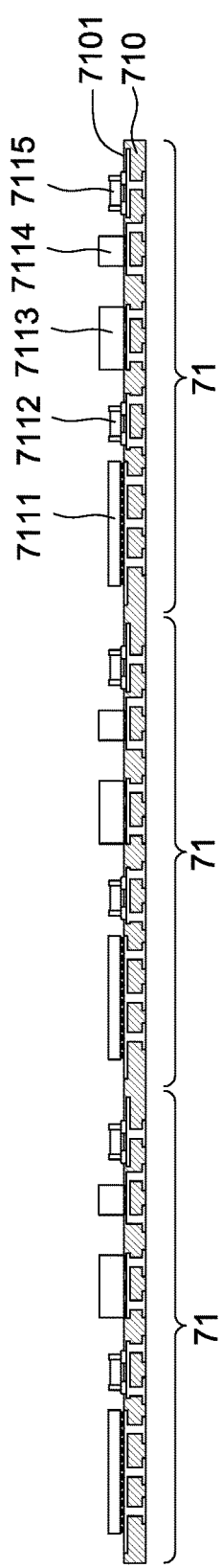

Referring to FIG. 8C, a strip substrate 710 may include a number of substrates 71. In some embodiments of the present disclosure, the strip substrate 710 may consist of a number of the substrates 71. A number of the semiconductor devices 7111, 7112, 7113, 7114 and 7115 are disposed on a surface 7101 of the strip substrate 710 and electrically connected to the strip substrate 710.

Figure 8D:
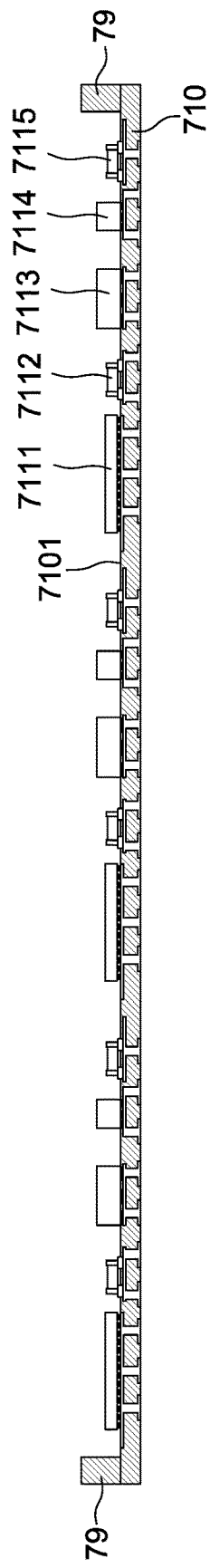

Referring to. FIG. 8D, a number of the supports 79 are arranged on the surface 7101 of the strip substrate 710.

Referring to FIG. 8E, the strip substrate 720 is mounted to the supports 79 such that the strip substrate 720 is stacked above the strip substrate 710. In some embodiments of the present disclosure, a tape 791 is arranged between the support 79 and the strip substrate 720. As shown in FIG. 8E, the surface 7201 of the strip substrate 720 faces the surface 7101 of the strip substrate 710, and the surface 7202 of the strip substrate 720 faces away from the surface 7101 of the strip substrate 710.

Referring to FIG. 8F, an encapsulant 75 is disposed on the strip substrates 710 and 720 and encapsulates the surfaces 7201, 7202 of the strip substrate 720, the semiconductor devices 7221, 7222, 7223, 7224 and 7225 on the surface 7202 of the strip substrate 720, the semiconductor devices 7211, 7212, 7213, 7214 and 7215 on the surface 7201 of the strip substrate 720, the surface 7101 of the strip substrate 710, the semiconductor devices 7111, 7112, 7113, 7114 and 7115 on the surface 7101 of the strip substrate 710, and the openings 77.

Figure 8G:
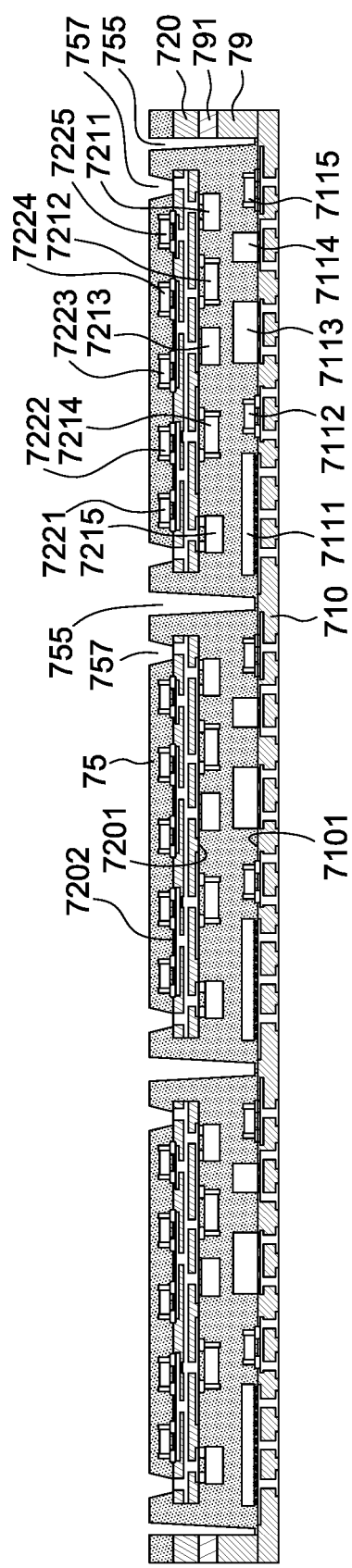

Referring to FIG. 8G, portions of the encapsulant 75 are removed by a laser process and thus portions of the surface 7101 of the strip substrate 710 and portions of the surface 7202 of the strip substrate 720 are exposed. As shown in FIG. 8G, after the portions of the encapsulant 75 are removed, the encapsulant 75 includes a number of the through holes 755 and a number of the through holes 757. The through hole 755 extends from an upper surface 753 of the encapsulant 75 to the surface 7101 of the strip substrate 710. Thus, a portion of the surface 7101 of the strip substrate 710 is exposed. Moreover, the through hole 755 passes through the opening 77. In some embodiments of the present disclosure, the through hole 755 is tapered from a top end to a bottom end thereof. Further, the through hole 757 extends from the upper surface 753 of the encapsulant 75 to the surface 7202 of the strip substrate 720. Thus, a portion of the surface 7202 of the strip substrate 720 is exposed. In some embodiments of the present disclosure, the through hole 757 is tapered from a top end to a bottom end thereof. In some embodiments of the present disclosure, the through hole 757 is adjacent to the through hole 755.

Figure 8H:
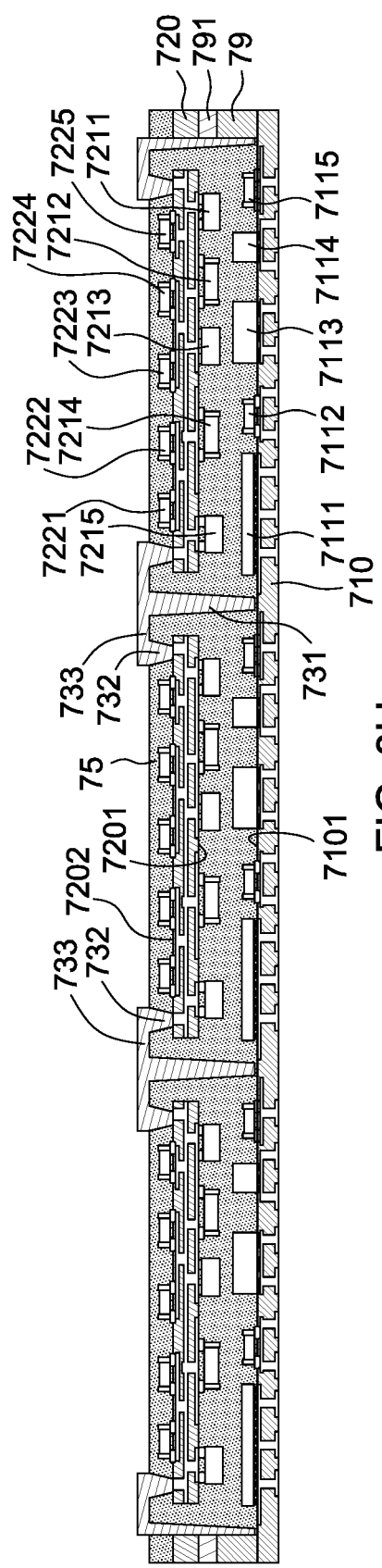

Referring to FIG. 8H, a plurality of vias 731 are formed in the through holes 755 and a plurality of vias 732 are formed in the through holes 757, and a plurality of bridges 733 are formed to electrically connect the vias 731 and vias 732. As shown in FIG. 8H, the via 731 is formed in the through hole 755 and contacts the surface 7101 of the strip substrate 710. Thus, the via 731 may extend from the upper surface 753 of the encapsulant 73 to the surface 7101 of the strip substrate 710 and pass through the opening 77. Thus, the via 731 electrically connects to the strip substrate 710. In some embodiments of the present disclosure, the via 731 is tapered from a top end to a bottom end thereof. Further, the via 732 is formed in the through hole 757 and contacts the surface 7202 of the strip substrate 720. Thus, the via 732 may extend from the upper surface 753 of the encapsulant 73 to the surface 7202 of the strip substrate 720. Thus, the via 732 electrically connects to the strip substrate 720. In some embodiments of the present disclosure, the via 732 is tapered from a top end to a bottom end thereof. Further, the bridge 733 is formed on the upper surface 733 of the encapsulant 73. One end of the bridge 733 connects to the via 731 and the other end of the bridge 733 connects to the via 732. Thus, the via 731 and the via 732 can electrically connect to each other by the bridge 733.

Referring to FIG. 8I, a number of the electric connections 78 are mounted to a surface 7102 of the strip substrate 710 and electrically connect to the strip substrate 710. The surface 7102 of the strip substrate 710 is opposite to the surface 7101 of the strip substrate 710.

Referring to FIG. 8J, a singulation process is performed by cutting through the via 731 and the strip substrates 710 and 720. The singulation may be performed, for example, by using a dicing saw, laser or other appropriate cutting technique. In some embodiments of the present disclosure, the singulation process may be achieved along a cut path 703 and the cut path 703 may substantially pass through the opening 77. After the singulation process, the strip substrate 710 is divided into a number of the substrates 71, and the strip substrate 720 is divided into a number of the substrates 72. Moreover, the cut path 703 may substantially pass through the via 731 as well, and thus the via 731 may have a side surface exposed from the encapsulant 75 after the singulation process.

After the manufacturing process as shown in FIG. 8A, FIG. 8B, FIG. 8C, FIG. 8D, FIG. 8E, FIG. 8F, FIG. 8G, FIG. 8H, FIG. 8I and FIG. 8J, the semiconductor device package 7 is formed (see FIG. 8I). In some embodiments, the semiconductor device package 7 is the same as, or similar to, the semiconductor device package 2 shown in FIG. 3A and FIG. 3B.

FIG. 9A, FIG. 9B, FIG. 9C, FIG. 9D, FIG. 9E, FIG. 9F, FIG. 9G, FIG. 9H, FIG. 9I, FIG. 9J and FIG. 9K illustrate a method for manufacturing a semiconductor device package 8 in accordance with some embodiments of the present disclosure.

Figure 9A:
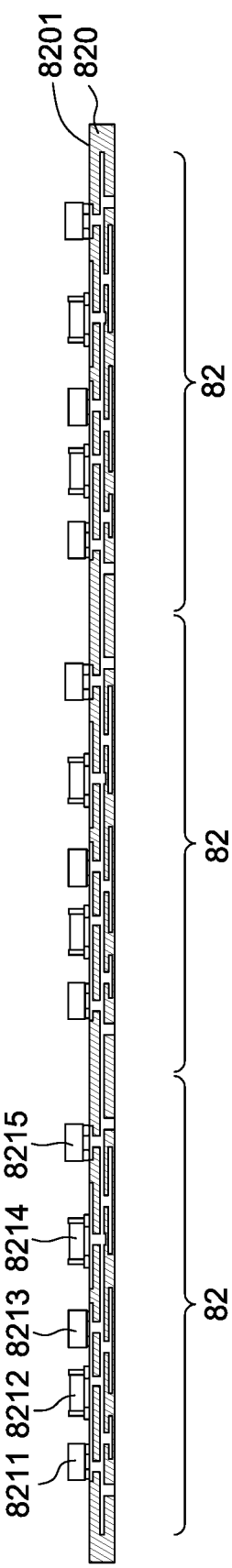

Referring to FIG. 9A, a strip substrate 820 may include a number of substrates 82. In some embodiments of the present disclosure, the strip substrate 820 may consist of a number of the substrates 82. A number of the semiconductor devices 8211, 8212, 8213, 8214 and 8215 are disposed on a surface 8201 of the strip substrate 820 and electrically connected to the strip substrate 820.

Figure 9B:
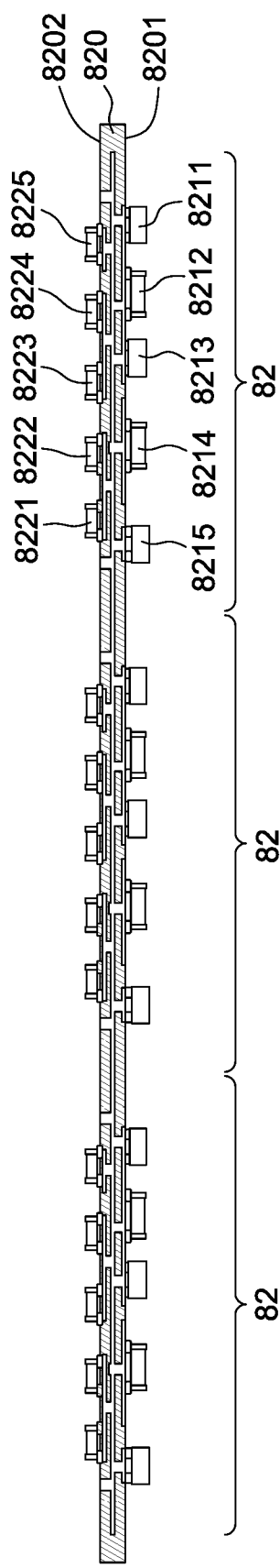

Referring to FIG. 9B, a number of the semiconductor devices 8221, 8222, 8223, 8224 and 8225 are disposed on a surface 8202 of the strip substrate 820 and electrically connected to the strip substrate 820. The surface 8202 of the substrate 820 is opposite to the surface 8201 of the substrate 820.

Referring to FIG. 9C, portions of the strip substrate 820 are removed so as to form a number of the openings 87 are formed at and pass through the strip substrate 820. In some embodiments of the present disclosure, the openings 87 are formed by a laser drilling process. In some embodiments of the present disclosure, the opening 87 is substantially located at an interface between two adjacent substrates 82. In other words, the opening 87 may be substantially located between two adjacent substrates 82. That is, the opening 87 causes the side surfaces 824 of the two adjacent substrates 82 to be exposed.

Referring to FIG. 9D, a strip substrate 810 may include a number of substrates 81. In some embodiments of the present disclosure, the strip substrate 810 may consist of a number of the substrates 81. A number of the semiconductor devices 8111, 8112, 8113, 8114 and 8115 are disposed on a surface 8101 of the strip substrate 810 and electrically connected to the strip substrate 810.

Figure 9E:
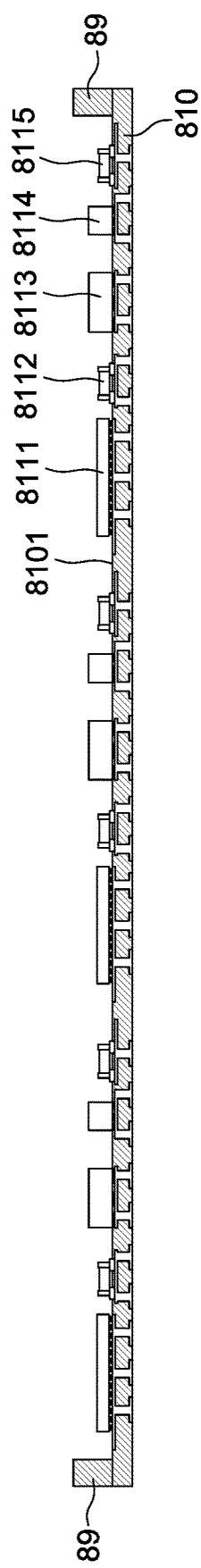

Referring to. FIG. 9E, a number of the supports 89 are arranged on the surface 8101 of the strip substrate 810.

Figure 9F:
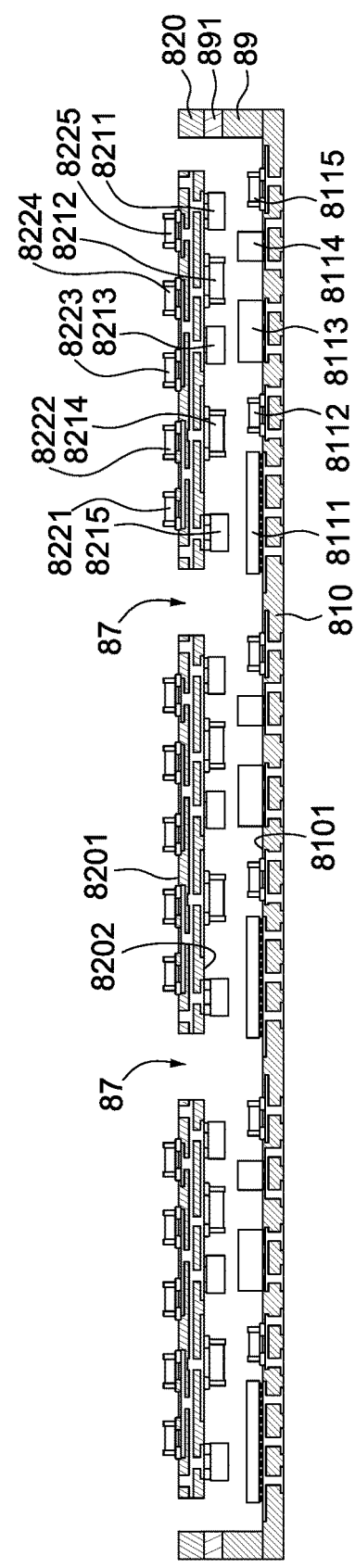

Referring to FIG. 9F, the strip substrate 820 is mounted to the supports 89 such that the strip substrate 820 is stacked above the strip substrate 810. In some embodiments of the present disclosure, a tape 891 is arranged between the support 89 and the strip substrate 820. As shown in FIG. 8F, the surface 8201 of the strip substrate 820 faces the surface 8101 of the strip substrate 810, and the surface 8202 of the strip substrate 820 faces away from the surface 8101 of the strip substrate 810.

Figure 9G:
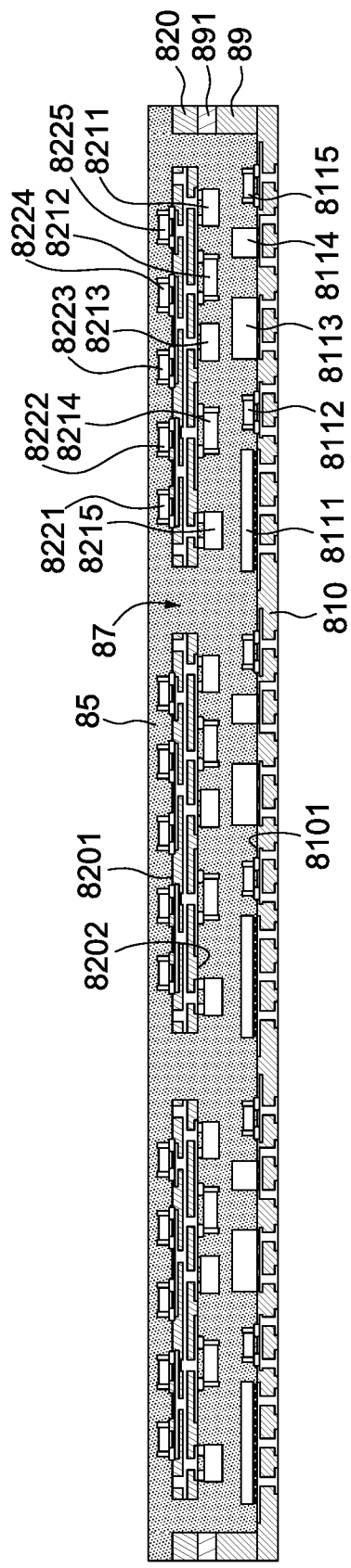

Referring to FIG. 9G, an encapsulant 85 is disposed on the strip substrates 810 and 820 and encapsulates the surfaces 8201, 8202 of the strip substrate 820, the semiconductor devices 8221, 8222, 8223, 8224 and 8225 on the surface 8202 of the strip substrate 820, the semiconductor devices 8211, 8212, 8213, 8214 and 8215 on the surface 8201 of the strip substrate 820, the surface 8101 of the strip substrate 810, the semiconductor devices 8111, 8112, 8113, 8114 and 8115 on the surface 8101 of the strip substrate 810, and the openings 87.

Figure 9H:
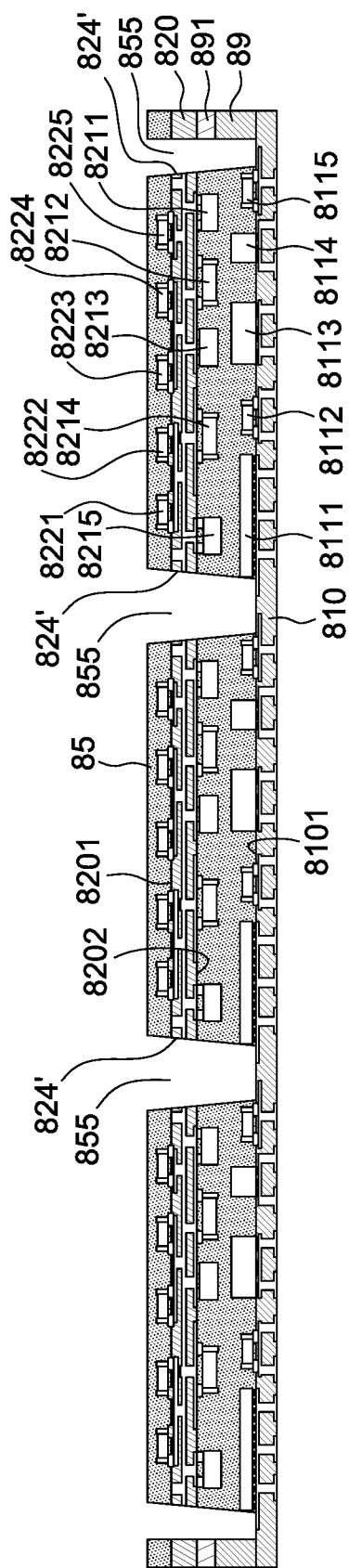

Referring to FIG. 9H, portions of the encapsulant 85 are removed by a laser process and thus portions of the surface 8101 of the strip substrate 810 and side surfaces 824' of the strip substrate 820 are exposed. In some embodiments of the present disclosure, portions of the strip substrate 820 may be removed during the laser process, and thus the side surfaces 824' of the strip substrate 820 are exposed. As shown in FIG. 9H, after the portions of the encapsulant 85 are removed, the encapsulant 85 includes a number of the through holes 855. The through hole 855 extends from an upper surface 853 of the encapsulant 85 to the surface 8101 of the strip substrate 810. Thus, a portion of the surface 8101 of the strip substrate 810 and the side surfaces 824' of the strip substrate 820 are exposed. In some embodiments of the present disclosure, the through hole 855 is tapered from a top end to a bottom end thereof.

Figure 9I:
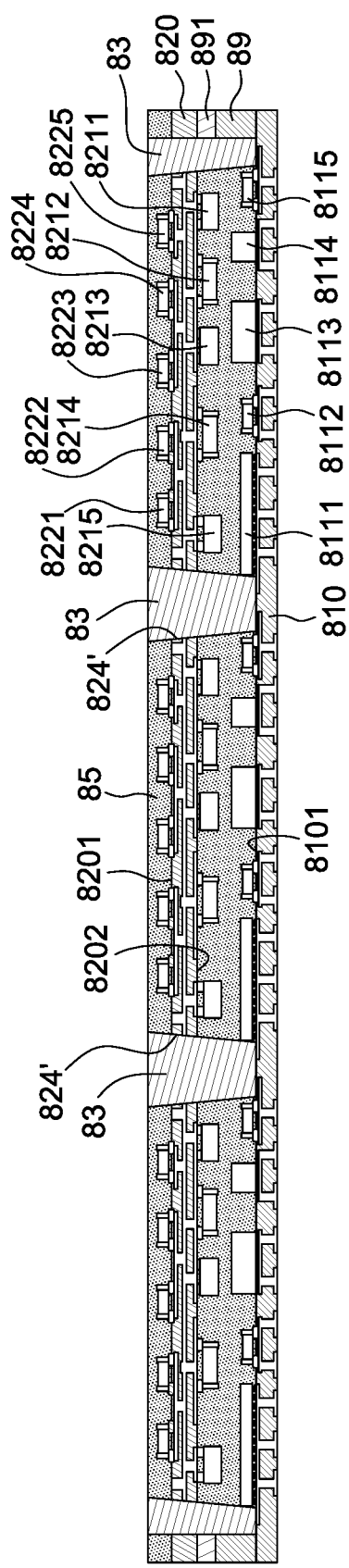

Referring to FIG. 9I, a plurality of vias 83 are formed in the through holes 855. As shown in FIG. 9I, the via 83 is formed in the through hole 855 and contacts the surface 8101 of the strip substrate 810 and the side surfaces 824' of the strip substrate 820. Thus, the via 83 may extend from the upper surface 853 of the encapsulant 83 to the surface 8101 of the strip substrate 810. Thus, the via 83 electrically connects to the strip substrates 810 and 820. In some embodiments of the present disclosure, the via 83 is tapered from a top end to a bottom end thereof.

Figure 9J:
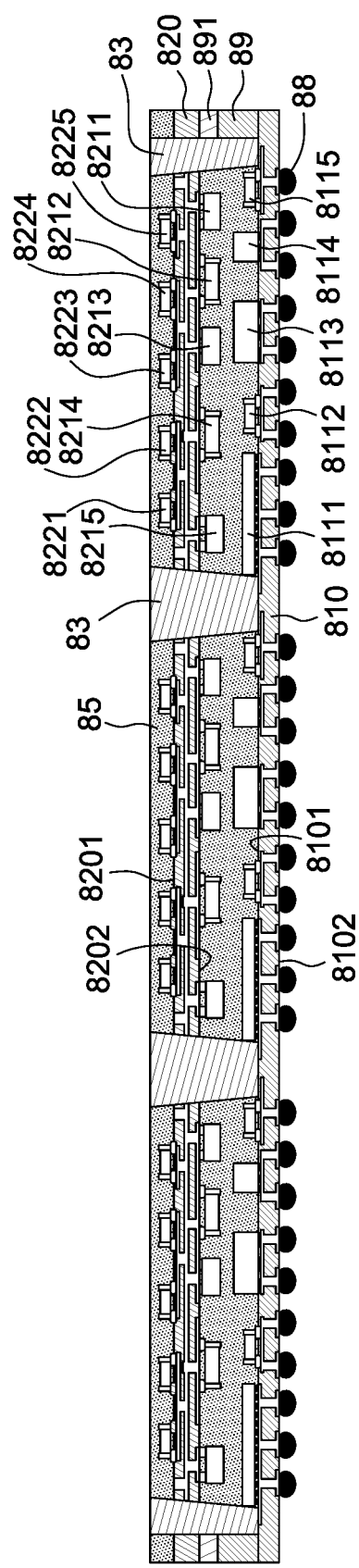

Referring to FIG. 9J, a number of the electric connections 88 are mounted to a surface 8102 of the strip substrate 810 and electrically connect to the strip substrate 810. The surface 8102 of the strip substrate 810 is opposite to the surface 8101 of the strip substrate 810.

Figure 9K:
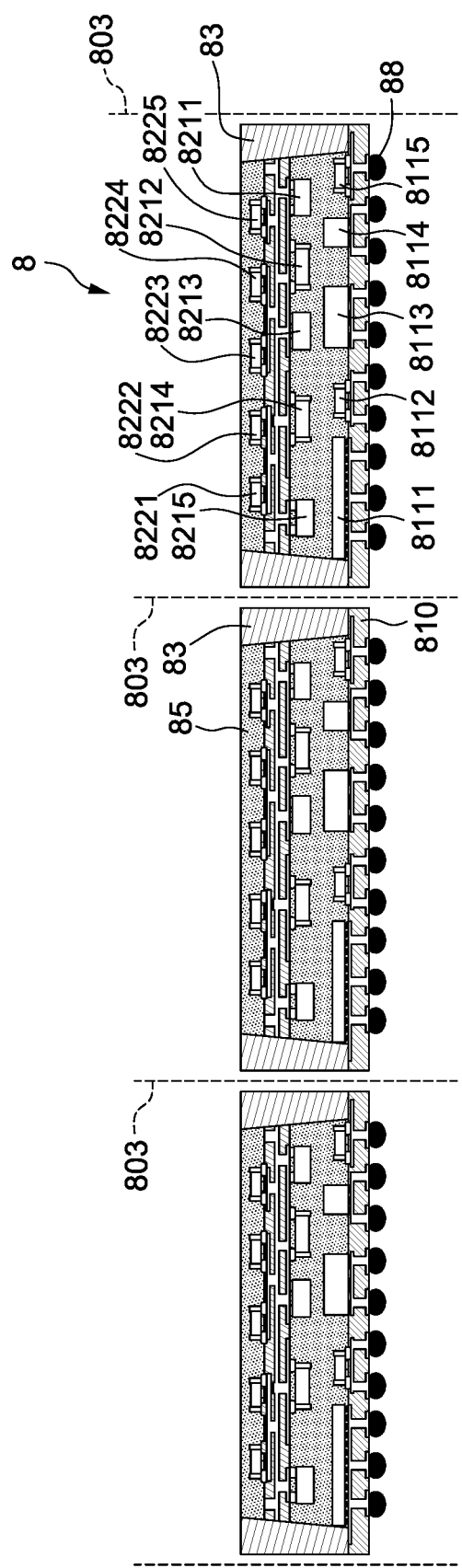

Referring to FIG. 9K, a singulation process is performed by cutting through the via 83 and the strip substrates 810 and 820. The singulation may be performed, for example, by using a dicing saw, laser or other appropriate cutting technique. In some embodiments of the present disclosure, the singulation process may be achieved along a cut path 803 and the cut path 803 may substantially pass through the opening 87. After the singulation process, the strip substrate 810 is divided into a number of the substrates 81, and the strip substrate 820 is divided into a number of the substrates 82. Moreover, the cut path 803 may substantially pass through the via 83 as well, and thus the via 83 may have a side surface exposed from the encapsulant 85 after the singulation process.

After the manufacturing process as shown in FIG. 9A, FIG. 9B, FIG. 9C, FIG. 9D, FIG. 9E, FIG. 9F, FIG. 9G, FIG. 9H, FIG. 9I, FIG. 9J and FIG. 9K, the semiconductor device package 8 is formed (see FIG. 9K). In some embodiments, the semiconductor device package 8 is the same as, or similar to, the semiconductor device package 3 shown in FIG. 4A and FIG. 4B.

FIG. 10A, FIG. 10B, FIG. 10C, FIG. 10D, FIG. 10E, FIG. 10F, FIG. 10G, FIG. 10H, FIG. 10I and FIG. 10J illustrate a method for manufacturing a semiconductor device package 9 in accordance with some embodiments of the present disclosure.

Figure 10A:
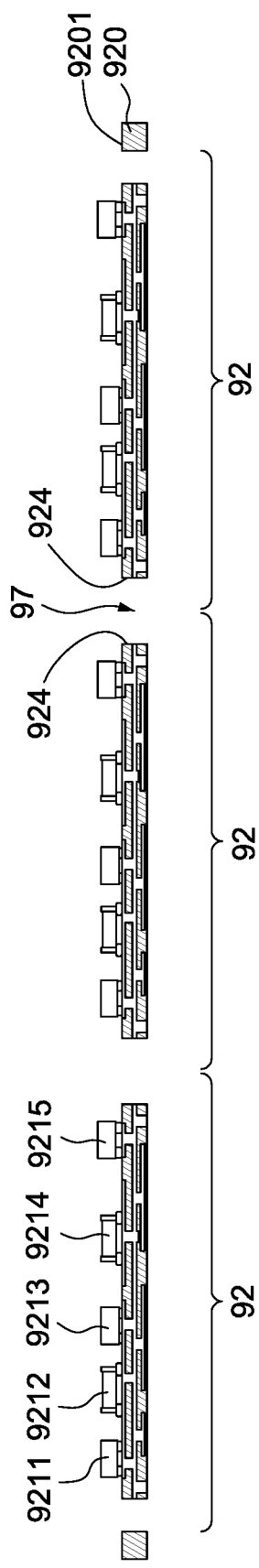
FIG. 10A, FIG. 10B, FIG. 10C, FIG. 10D, FIG. 10E, FIG. 10F, FIG. 10G, FIG. 10H, FIG. 10I and FIG. 10J, illustrate a method of manufacturing a semiconductor device package in accordance with another embodiment of the instant disclosure.
Figure 10B:
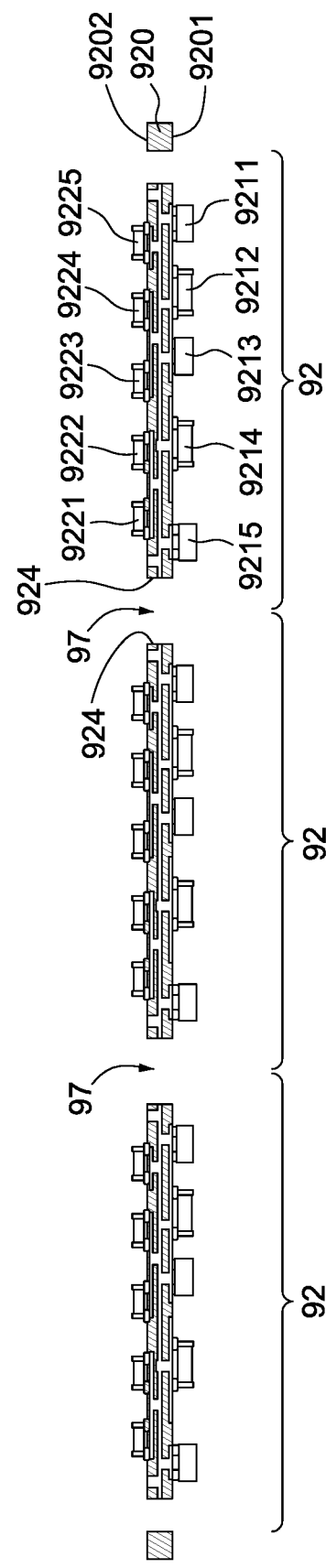
Figure 10C:
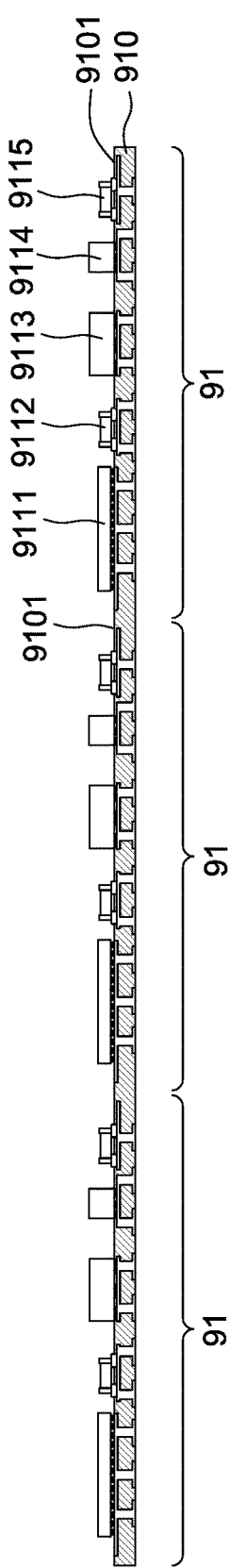

Referring to FIG. 10A, a strip substrate 920 may include a number of substrates 92. In some embodiments of the present disclosure, the strip substrate 920 may consist of a number of the substrates 92. A number of the semiconductor devices 9211, 9212, 9213, 9214 and 9215 are disposed on a surface 9201 of the strip substrate 920 and electrically connected to the strip substrate 920. Moreover, the strip substrate 920 further includes a number of openings 97 passing through the strip substrate 920. In some embodiments of the present disclosure, the opening 97 is substantially located at an interface between two adjacent substrates 92. In other words, the opening 97 may be substantially located between two adjacent substrates 92. That is, the opening 97 causes the side surfaces 924 of the two adjacent substrates 92 to be exposed.

Referring to FIG. 9B, a number of the semiconductor devices 9221, 9222, 9223, 9224 and 9225 are disposed on a surface 9202 of the strip substrate 920 and electrically connected to the strip substrate 920. The surface 9202 of the strip substrate 920 is opposite to the surface 9201 of the strip substrate 920.

Referring to FIG. 9C, a strip substrate 910 may include a number of substrates 91. In some embodiments of the present disclosure, the strip substrate 910 may consist of a number of the substrates 91. A number of the semiconductor devices 9111, 9112, 9113, 9114 and 9115 are disposed on a surface 9101 of the strip substrate 910 and electrically connected to the strip substrate 910.

Figure 10D:
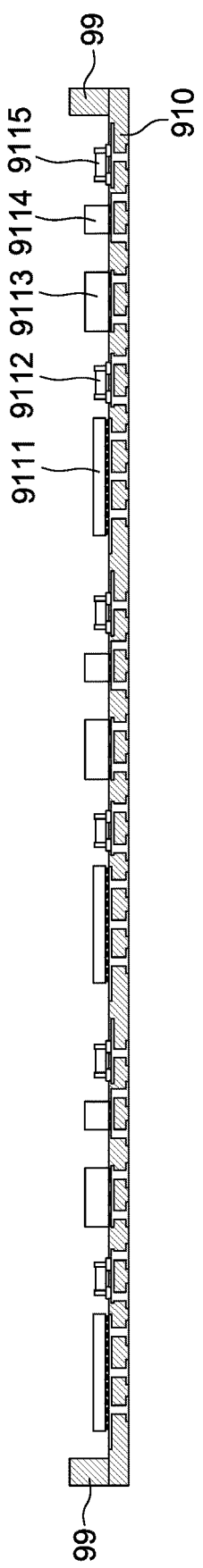

Referring to. FIG. 10D, a number of the supports 99 are arranged on the surface 9101 of the strip substrate 910.

Figure 10E:
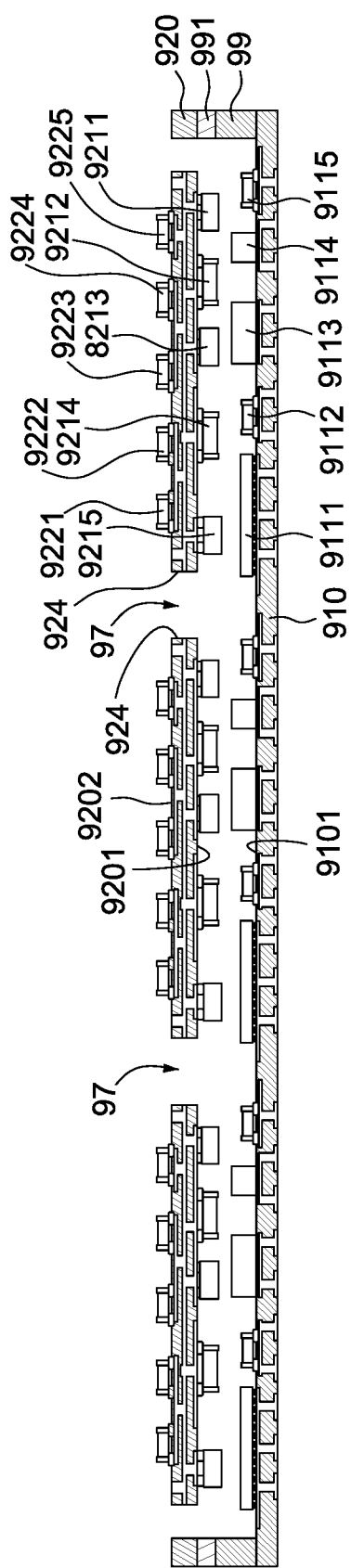

Referring to FIG. 10E, the strip substrate 920 is mounted to the supports 99 such that the strip substrate 920 is stacked above the strip substrate 910. In some embodiments of the present disclosure, a tape 991 is arranged between the support 99 and the strip substrate 920. As shown in FIG. 9E, the surface 9201 of the strip substrate 920 faces the surface 9101 of the strip substrate 910, and the surface 9202 of the strip substrate 920 faces away from the surface 9101 of the strip substrate 910.

Figure 10F:
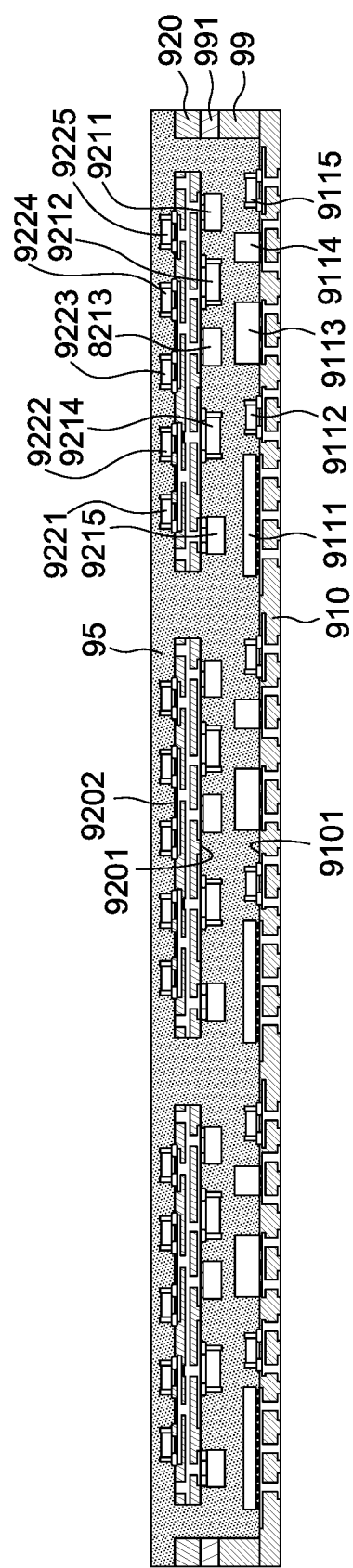

Referring to FIG. 10F, an encapsulant 95 is disposed on the strip substrates 910 and 920 and encapsulates the surfaces 9201, 9202 of the strip substrate 920, the semiconductor devices 9221, 9222, 9223, 9224 and 9225 on the surface 9202 of the strip substrate 920, the semiconductor devices 9211, 9212, 9213, 9214 and 9215 on the surface 9201 of the strip substrate 920, the surface 9101 of the strip substrate 910, the semiconductor devices 9111, 9112, 9113, 9114 and 9115 on the surface 9101 of the strip substrate 910, and the openings 97.

Figure 10G:
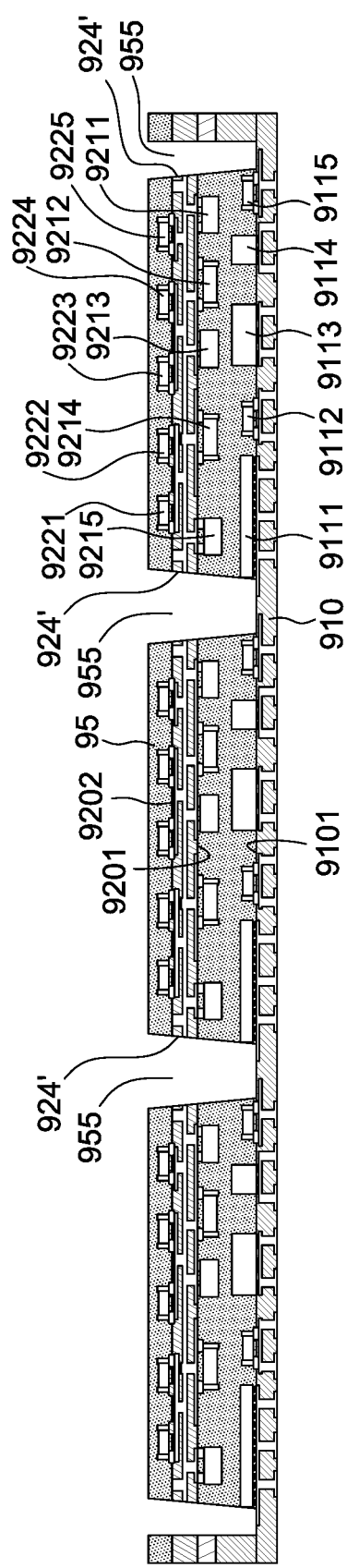

Referring to FIG. 10G, portions of the encapsulant 95 are removed by a laser process and thus portions of the surface 9101 of the strip substrate 910 and side surfaces 924' of the strip substrate 920 are exposed. In some embodiments of the present disclosure, portions of the strip substrate 920 may be removed during the laser process, and thus the side surfaces 924' of the strip substrate 920 are exposed. As shown in FIG. 10G, after the portions of the encapsulant 95 are removed, the encapsulant 95 includes a number of the through holes 955. The through hole 955 extends from an upper surface 953 of the encapsulant 95 to the surface 9101 of the strip substrate 910. Thus, a portion of the surface 9101 of the strip substrate 910 and the side surfaces 924' of the strip substrate 920 are exposed. In some embodiments of the present disclosure, the through hole 955 is tapered from a top end to a bottom end thereof.

Figure 10H:
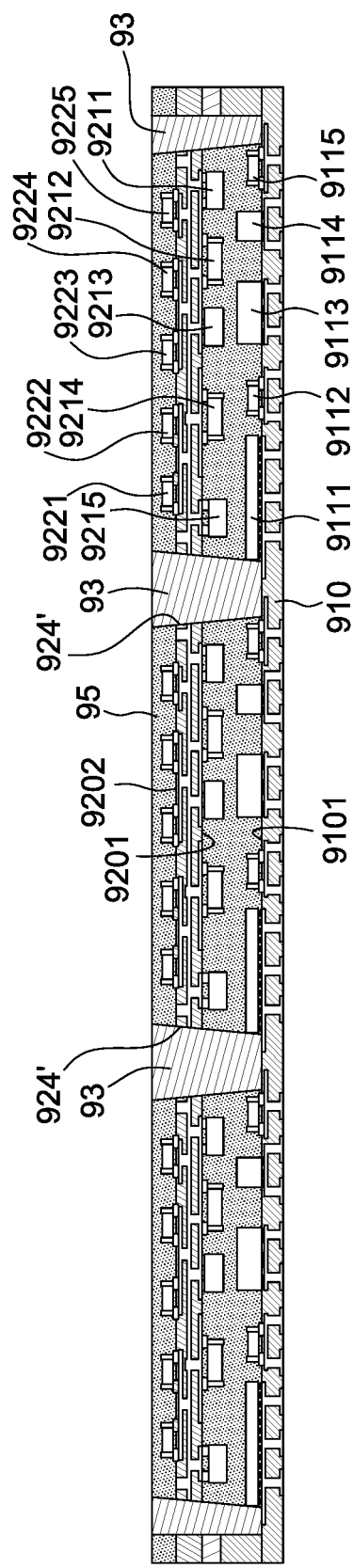

Referring to FIG. 10H, a plurality of vias 93 are formed in the through holes 955. As shown in FIG. 10H, the via 93 is formed in the through hole 955 and contacts the surface 9101 of the strip substrate 910 and the side surfaces 924' of the strip substrate 920. Thus, the via 93 may extend from the upper surface 953 of the encapsulant 93 to the surface 9101 of the strip substrate 910. Thus, the via 93 electrically connects to the strip substrates 910 and 920. In some embodiments of the present disclosure, the via 93 is tapered from a top end to a bottom end thereof.

Figure 10I:
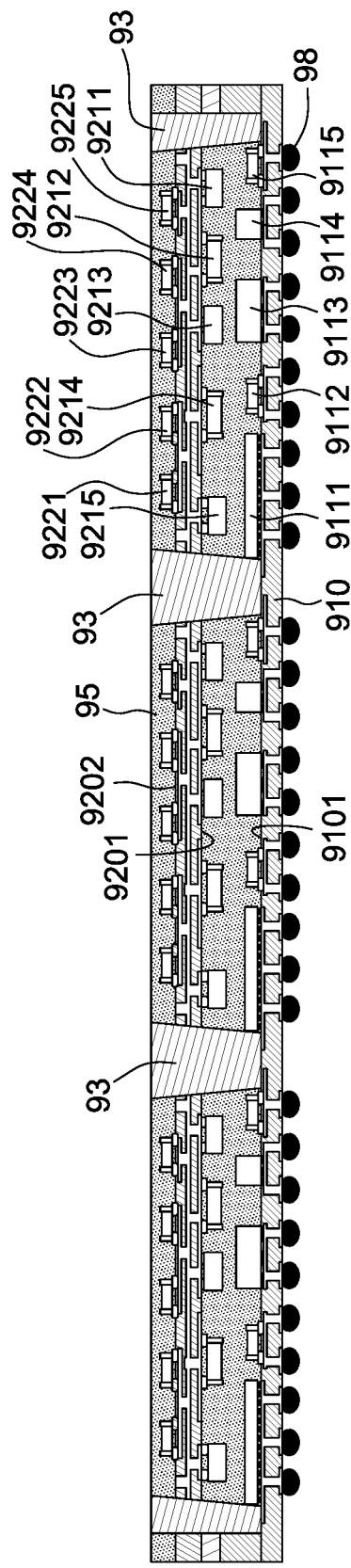

Referring to FIG. 10I, a number of the electric connections 98 are mounted to a surface 9102 of the strip substrate 910 and electrically connect to the strip substrate 910. The surface 9102 of the strip substrate 910 is opposite to the surface 9101 of the strip substrate 910.

Figure 10J:
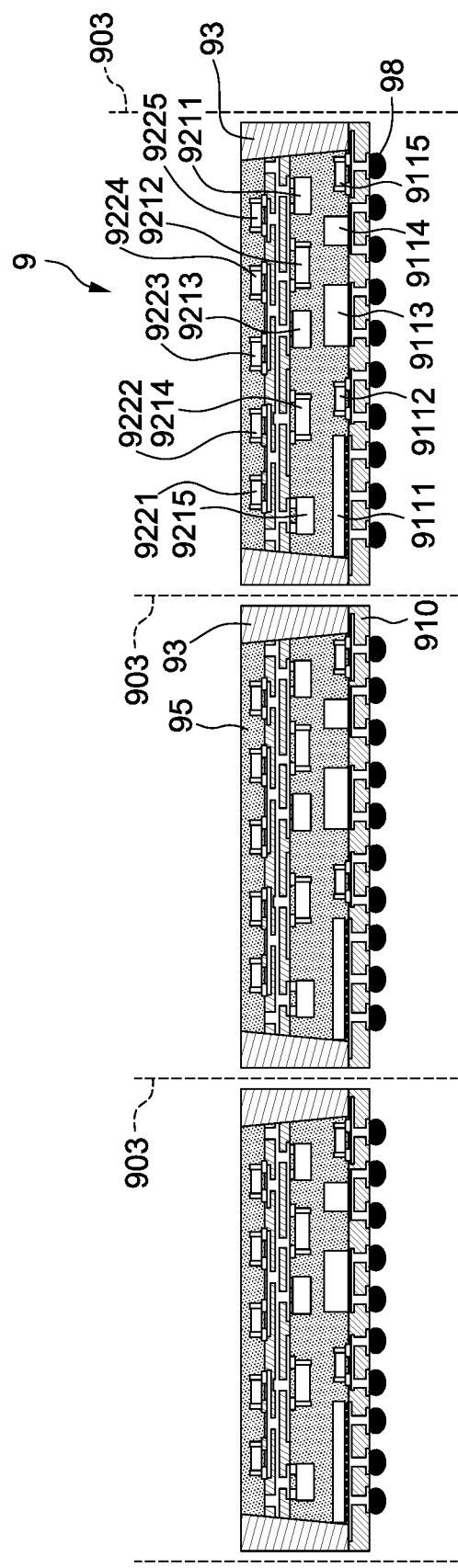

Referring to FIG. 10J, a singulation process is performed by cutting through the via 93 and the strip substrates 910 and 920. The singulation may be performed, for example, by using a dicing saw, laser or other appropriate cutting technique. In some embodiments of the present disclosure, the singulation process may be achieved along a cut path 903 and the cut path 903 may substantially pass through the opening 97. After the singulation process, the strip substrate 910 is divided into a number of the substrates 91, and the strip substrate 920 is divided into a number of the substrates 92. Moreover, the cut path 903 may substantially pass through the via 93 as well, and thus the via 93 may have a side surface exposed from the encapsulant 95 after the singulation process.

After the manufacturing process as shown in FIG. 10A, FIG. 10B, FIG. 10C, FIG. 10D, FIG. 10E, FIG. 10F, FIG. 10G, FIG. 10H, FIG. 10I and FIG. 10J, the semiconductor device package 9 is formed (see FIG. 10J). In some embodiments, the semiconductor device package 9 is the same as, or similar to, the semiconductor device package 3 shown in FIG. 4A and FIG. 4B.

FIG. 11A is a top view of a semiconductor device package 10 in accordance with an embodiment of the instant disclosure, and FIG. 11B illustrates a cross-sectional view along line A-A in FIG. 11A. As shown in FIG. 11A and FIG. 11B, the semiconductor device package 10 includes substrates 101 and 102, semiconductor devices 1031, 1032, 1033, 1034, 1035, 1036, 1041, 1042, 1043 and 1044, bonded wires 103, an encapsulant 105 and electric connections 108. In some embodiments, the substrate 101 may be a core substrate or a core-less substrate. The substrate 101 may include traces, pads or interconnections for electrical connection. The substrate 101 has a surface 1011 and a surface 1012 opposite to the surface 1011. A number of the semiconductor devices 1041, 1042, 1043 and 1044 are disposed or mounted on the surface 1011 of the substrate 101. The semiconductor devices 1041, 1042, 1043 and 1044 may be a die, an active device, a passive device, and/or other electronic devices. The semiconductor devices 1041, 1042, 1043 and 1044 may electrically connected to the substrate 101 via flip-chip bonding or wire bonding. Further, a number of the electrical connections 108 are mounted or disposed on the surface 1012 of the substrate 101. The electrical connection 108 may include solder balls or solder bumps such as C4 bumps for connecting an external component such as a PCB.

In some embodiments, the substrate 102 may be a core substrate or a core-less substrate. The substrate 102 may include traces, pads or interconnections for electrical connection. The substrate 102 has a surface 1021 facing the surface 1011 of the substrate 101 and a surface 1022 opposite to the surface 1021. Thus, the substrate 102 is substantially arranged above the substrate 101. A number of the semiconductor devices 1034, 1035 and 1036 are disposed or mounted on the surface 1021 of the substrate 102, and a number of the semiconductor devices 1031, 1032 and 1033 are disposed or mounted on the surface 1022 of the substrate 102. The semiconductor devices 1031, 1032, 1033, 1034, 1035 and 1036 may be a die, an active device, a passive device, and/or other electronic devices. The semiconductor devices 1031, 1032, 1033, 1034, 1035 and 1036 may electrically connected to the substrate 22 via flip-chip bonding or wire bonding.

The substrate 101 has a surface 1013 (e.g., a side surface) and the substrate 102 has a surface 1023 (e.g., a side surface). In some embodiments of the present disclosure, the surface 1013 and the surface 1023 are coplanar with each other. In some embodiments of the present disclosure, the substrate 22 includes an opening 107 which is adjacent to a side surface 1025 of the substrate 102. Thus, the substrate 102 has a side surface 1026 connecting to the side surface 1025 and a side surface 1024 connecting to the surface 1026. In some embodiments of the present disclosure, the surfaces 1024 and 1026 are connected to each other. In some embodiments of the present disclosure, the surfaces 1024 and 1026 are not coplanar with each other. The surfaces 1024 and 1026 are portions of the inner walls of the opening 107. In other words, the opening 107 includes the side surfaces 1024 and 1026. From a top view perspective, the surfaces 1024 and 1026 can be disposed on the surface 1011 of the substrate 101.

As shown in FIG. 11B, the encapsulant 115 (i.e., package body) covering or encapsulating the surface 1011 of substrate 101, the surfaces 1021, 1022, 1024 and 1026 of the substrate 102 and the semiconductor devices 1031, 1032, 1033, 1034, 1035, 1036, 1041, 1042, 1043 and 1044. The encapsulant 105 may include molding compounds, such as a Novolac-based resin, an epoxy-based resin, a silicone-based resin, or other another suitable encapsulant; fillers such as silicon oxide fillers, may be included in the molding compound. In addition, the encapsulant 105 may include a molding underfill (MUF) or a capillary underfill (CUF).

As shown in FIG. 11A and FIG. 11B, a number of the bonded wires 103 electrically connect the substrate 101 and electrically connect the substrate 102, and pass through the openings 107. Thus, the substrates 101 and 102 are electrically connected to each other by the bonded wires 103. Referring to FIG. 11B, one end of the bonded wire 103 contacts the surface 1022 of the substrate 102 and the other end of the bonded wire 103 contacts the surface 1011 of the substrate 101, and the bonded wire 103 passes through the opening 107. From the top view perspective, the bonded wire 103 overlaps the surface 1021 of the substrate 102 and the surface 1011 of the substrate 1011. Moreover, since the bonded wire 103 passes through the opening 107, the bonded wire 103 overlaps the surface 1024 in a view taken from a direction orthogonal to the surface 1024 and the bonded wire 103 overlaps the surface 1026 in a view taken from a direction orthogonal to the side surface 1026. That is, the bonded wire 103 overlaps the surface 1024 or the surface 1026 from a side view perspective. In other words, the bonded wire 103 overlaps the inner wall of the opening 107 (the surface 1024 or the surface 1026) in a view taken from a direction substantially parallel to the surface 1021 or the surface 1022 of the substrate 102.

FIG. 12A is a top view of a semiconductor device package 20 in accordance with an embodiment of the instant disclosure, and FIG. 12B illustrates a cross-sectional view along line B-B in FIG. 12A. As shown in FIG. 12A and FIG. 12B, the semiconductor device package 20 includes substrates 201 and 202, semiconductor devices 2031, 2032, 2033, 2034, 2035, 2036, 2041, 2042, 2043 and 2044, bonded wires 203, an encapsulant 205 and electric connections 208. In some embodiments, the substrate 201 may be a core substrate or a core-less substrate. The substrate 201 may include traces, pads or interconnections for electrical connection. The substrate 201 has a surface 2011 and a surface 2012 opposite to the surface 2011. A number of the semiconductor devices 2041, 2042, 2043 and 2044 are disposed or mounted on the surface 2011 of the substrate 201. The semiconductor devices 2041, 2042, 2043 and 2044 may be a die, an active device, a passive device, and/or other electronic devices. The semiconductor devices 2041, 2042, 2043 and 2044 may electrically connected to the substrate 201 via flip-chip bonding or wire bonding. Further, a number of the electrical connections 208 are mounted or disposed on the surface 2012 of the substrate 201. The electrical connection 208 may include solder balls or solder bumps such as C4 bumps for connecting an external component such as a PCB.

In some embodiments, the substrate 202 may be a core substrate or a core-less substrate. The substrate 202 may include traces, pads or interconnections for electrical connection. The substrate 202 has a surface 2021 facing the surface 2011 of the substrate 201 and a surface 2022 opposite to the surface 2021. Thus, the substrate 202 is substantially arranged above the substrate 201. A number of the semiconductor devices 2034, 2035 and 2036 are disposed or mounted on the surface 2021 of the substrate 202, and a number of the semiconductor devices 2031, 2032 and 2033 are disposed or mounted on the surface 2022 of the substrate 202. The semiconductor devices 2031, 2032, 2033, 2034, 2035 and 2036 may be a die, an active device, a passive device, and/or other electronic devices. The semiconductor devices 2031, 2032, 2033, 2034, 2035 and 2036 may electrically connected to the substrate 22 via flip-chip bonding or wire bonding.

The substrate 201 has a surface 2013 (e.g., a side surface) and the substrate 202 has a surface 2023 (e.g., a side surface). In some embodiments of the present disclosure, the surface 2013 and the surface 2023 are coplanar with each other. In some embodiments of the present disclosure, the substrate 22 includes an opening 207 passing through the substrate 22. Thus, the substrate 202 has side surfaces 2024 and 2026 connecting to each other, and the surfaces 2024 and 2026 are portions of the inner walls of the opening 207. From a top view perspective, the surfaces 2024 and 2026 can be disposed on the surface 2011 of the substrate 201.

As shown in FIG. 12A and FIG. 12B, a number of the bonded wires 203 electrically connect the substrate 201 and electrically connect the substrate 202, and pass through the openings 207. Thus, the substrates 201 and 202 are electrically connected to each other by the bonded wires 203. Referring to FIG. 12B, one end of the bonded wire 203 contacts the surface 2022 of the substrate 202 and the other end of the bonded wire 203 contacts the surface 2011 of the substrate 201, and the bonded wire 203 passes through the opening 2017. From the top view perspective, the bonded wire 203 overlaps the surface 2021 of the substrate 202 and the surface 2011 of the substrate 2011. Moreover, since the bonded wire 203 passes through the opening 2017, the bonded wire 203 overlaps the surface 2024 in a view taken from a direction orthogonal to the surface 2024 and the bonded wire 203 overlaps the surface 2026 in a view taken from a direction orthogonal to the side surface 2026. That is, the bonded wire 203 overlaps the surface 2024 or the surface 2026 from a side view perspective. In other words, the bonded wire 203 overlaps the inner wall of the opening 207 (the surface 2024 or the surface 2026) in a view taken from a direction substantially parallel to the surface 2021 or the surface 2022 of the substrate 202.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a first substrate having a first side surface;
   a second substrate arranged above the first substrate, wherein the second substrate has a first outer lateral side surface substantially aligned with the first side surface of the first substrate, and wherein the second substrate has a recess recessed with respect to the first outer lateral side surface of the second substrate, wherein the recess is located at a corner of the second substrate; and
   an interconnection passing through the recess and connecting to the first substrate and the second substrate.

2. The semiconductor device package of claim 1, wherein the recess has a first inner side surface and a second inner side surface connected to the first inner side surface, and the first inner side surface and the second inner side surface are non-parallel with each other and wherein the interconnection overlaps an inner side surface of the recess from a side view perspective.

3. The semiconductor device package of claim 2, wherein the first inner side surface is substantially perpendicular to the second inner side surface.

4. The semiconductor device package of claim 2, wherein the first inner side surface is connected to the first outer lateral side surface of the second substrate.

5. The semiconductor device package of claim 4, wherein the second inner side surface is connected to a second outer lateral side surface of the second substrate non-parallel with the first outer lateral side surface of the second substrate.

6. The semiconductor device package of claim 1, wherein a projection of the recess on the first substrate is located at a corner of the first substrate from a top view perspective.

7. The semiconductor device package of claim 1, wherein an inner surface of the recess is connected to the first outer lateral surface of the second substrate, and wherein an encapsulant encapsulates the second substrate and extends into the recess, and wherein the first outer lateral side surface of the second substrate is exposed from the encapsulant.

8. The semiconductor device package of claim 1, wherein a first electronic device is disposed over the first substrate, and the recess overlaps the first electronic device in a direction perpendicular to a bottom surface of the second substrate.

9. The semiconductor device package of claim 8, wherein the recess partially overlaps the first electronic device from a top view perspective.

10. The semiconductor device package of claim 1, wherein an electrical connection is disposed on a bottom surface of the first substrate, and the recess overlaps the electrical connection in a direction perpendicular to a bottom surface of the second substrate.

11. A semiconductor device package, comprising:
    a first substrate having a top surface and a lateral side surface;
    a second substrate arranged over the first substrate, wherein the second substrate has a first outer lateral side surface including a first potion substantially aligned with the lateral side surface of the first substrate and a second portion over the top surface; and an interconnection connected to the first substrate and the second substrate and adjacent to the second portion of first outer lateral side surface of the second substrate; wherein the first portion and the second portion are located at the same side of the second substrate.

12. The semiconductor device package of claim 11, wherein the second portion of the first outer lateral side surface of the second substrate includes a first inner side surface connected to the first portion and a second inner side surface connected to the first inner side surface, and
wherein the first inner side surface and the second inner side surface are non-parallel, and a width of the first inner side surface differs from a width of the second inner side surface.

13. The semiconductor device package of claim 12, further comprising a plurality of interconnections including the interconnection, wherein a first one of the plurality of interconnections intersects the first inner side surface from a top view perspective and a second one of the plurality of interconnections intersects the second inner side surface from the top view perspective.

14. The semiconductor device package of claim 13, wherein the first one of the plurality of interconnections and the second one of the plurality of interconnections are non-parallel from the top view perspective.

15. The semiconductor device package of claim 14, wherein the first one of the plurality of interconnections and the second one of the plurality of interconnections collectively define a space tapered toward the first substrate from the top view perspective.

16. The semiconductor device package of claim 13, wherein the width of the first inner side surface is less than the width of the second inner side surface, and from the top view perspective a number of the plurality of interconnections intersecting the first inner side surface is greater than a number of the plurality of interconnections intersecting the second inner side surface.

17. A semiconductor device package, comprising:
a first substrate having a first lateral side surface;
a second substrate over the first substrate, wherein the second substrate has an outer lateral side surface substantially aligned with the first lateral side surface of the first substrate, wherein the second substrate has an opening;
at least one electronic device disposed between the first substrate and second substrate; and
an interconnection passing through the opening and connecting to the first substrate and the second substrate;
wherein the interconnection overlaps a side surface of the opening from a side view perspective,
wherein the second substrate includes a bottom surface facing the first substrate and a top surface opposite to the bottom surface, and a second electronic device is disposed on the top surface of the second substrate.

18. The semiconductor device package of claim 17, further comprising an encapsulant between the first substrate and the second substrate and configured to provide a support for the second substrate.

19. The semiconductor device package of claim 17, wherein a first one of the at least first electronic device is mounted on the first substrate and a second one of the first electronic device is mounted on the second substrate.

\* \* \* \* \*